(12) United States Patent
Takahashi et al.

(10) Patent No.: US 10,681,810 B2
(45) Date of Patent: Jun. 9, 2020

(54) ELECTRONIC CONTROL DEVICE

(71) Applicant: HITACHI AUTOMOTIVE SYSTEMS, LTD., Hitachinaka-shi, Ibaraki (JP)

(72) Inventors: Mototaka Takahashi, Ota (JP); Fumihiko Kuwabara, Isesaki (JP); Hirofumi Watanabe, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 16/331,510

(22) PCT Filed: Aug. 23, 2017

(86) PCT No.: PCT/JP2017/030012
§ 371 (c)(1),
(2) Date: Mar. 7, 2019

(87) PCT Pub. No.: WO2018/055967
PCT Pub. Date: Mar. 29, 2018

(65) Prior Publication Data
US 2019/0208634 A1  Jul. 4, 2019

(30) Foreign Application Priority Data
Sep. 20, 2016  (JP) ................. 2016-182559

(51) Int. Cl.
*H05K 1/02* (2006.01)
*H05K 3/34* (2006.01)
(Continued)

(52) U.S. Cl.
CPC ........... *H05K 1/116* (2013.01); *H01R 12/721* (2013.01); *H05K 3/325* (2013.01); *H05K 3/3452* (2013.01)

(58) Field of Classification Search
CPC .. H05K 1/02; H05K 3/34; H05K 3/36; H05K 3/366; H01R 12/00
(Continued)

(56) References Cited

U.S. PATENT DOCUMENTS 6,358,067 B1 * 3/2002 Takase ................. H01R 12/716
439/541.5
6,986,682 B1 * 1/2006 Jeon ..................... H01R 13/658
439/607.07
(Continued)

FOREIGN PATENT DOCUMENTS

JP  2010-025243 A  2/2010
JP  2010-067776 A  3/2010
(Continued)

OTHER PUBLICATIONS

Office Action issued in corressponding Japanese Patent Application No. 2016-182559 dated Nov. 5, 2019.

*Primary Examiner* — Xiaoliang Chen
(74) *Attorney, Agent, or Firm* — Foley & Lardner LLP

(57) ABSTRACT

A circuit board (3) of an electronic control device has a connector fixing screw penetration hole (16) which a connector fixing screw penetrates, a resist layer (13) and a joining portion (23) which is formed at a circumference of connector fixing screw penetration hole (16) and to which the connector fixing screw can be soldered. Joining portion (23) is formed at an inner side of a resist layer opening (22) which is open at the circumference of connector fixing screw penetration hole (16). Joining portion (23) is formed so that an area of joining portion (23) located at an inner side of circuit board (3) with respect to a center (C1) of connector fixing screw penetration hole (16) is larger than an area of joining portion (23) located at an outer side of circuit board (3) with respect to the center (C1) of connector fixing screw penetration hole (16).

12 Claims, 10 Drawing Sheets

(51) Int. Cl.
*H05K 3/36* (2006.01)
*H01R 12/00* (2006.01)
*H05K 1/11* (2006.01)
*H01R 12/72* (2011.01)
*H05K 3/32* (2006.01)

(58) Field of Classification Search
USPC ...... 174/261, 250, 262; 439/65, 78, 79, 328, 439/541.5, 573, 607.07
See application file for complete search history.

(56) References Cited

U.S. PATENT DOCUMENTS

| | | |
|---|---|---|
| 8,193,453 B2 | 6/2012 | Hasegawa et al. |
| 8,432,702 B2 | 4/2013 | Hasegawa et al. |
| 2005/0260888 A1* | 11/2005 | Kanehira ................. H01R 4/64 439/573 |
| 2009/0111296 A1* | 4/2009 | Zhu ........................ H05K 7/142 439/78 |
| 2013/0034984 A1* | 2/2013 | Annis ................ H01R 12/7029 439/328 |
| 2013/0063921 A1* | 3/2013 | Ito ............................ H05K 7/12 361/807 |
| 2015/0250048 A1* | 9/2015 | Kinoshita ............ H05K 1/0215 174/261 |

FOREIGN PATENT DOCUMENTS

| | | | |
|---|---|---|---|
| JP | 2010-067777 A | 3/2010 | |
| JP | 2010-267679 A | 11/2010 | |
| JP | 2014-197618 A | 10/2014 | |
| JP | 2015-148308 A | 8/2015 | |
| JP | 2015-162567 A | 9/2015 | |

* cited by examiner

ELECTRONIC CONTROL DEVICE

TECHNICAL FIELD

The present invention relates to an electronic control device.

BACKGROUND ART

Patent Document 1 discloses a technique of soldering a solder land located at an edge portion side of an insulating board using laser.

CITATION LIST

Patent Document

Patent Document 1: Japanese Unexamined Patent Application Publication No. JP2014-197618

SUMMARY OF THE INVENTION

Technical Problem

In a case where a flow soldering is performed, instead of using the laser, to the solder land formed at the edge portion side of the insulating board, however, soldering jet by flow soldering is harder to be stable toward the board edge portion side of the solder land. Because of this, there is a risk that variations in adhesion of solder will occur in the solder land located at the edge portion side of the insulating board.

Solution to Problem

According to one aspect of the present invention, a circuit board of an electronic control device has a penetration hole which a fixing member for fixing the connector to the circuit board penetrates, a resist layer and a joining portion which is formed at a circumference of the penetration hole and to which the fixing member can be soldered. The joining portion is formed at an inner side of the resist layer opening which is open at the circumference of the penetration hole. And, the joining portion is formed so that an area of the joining portion located at an inner side of the circuit board with respect to a center of the penetration hole is larger than an area of the joining portion located at an outer side of the circuit board with respect to the center of the penetration hole.

Effects of the Invention

According to the present invention, since the joining portion is formed so that the area of the joining portion located at the inner side of the circuit board with respect to the center of the penetration hole is relatively larger, the area of the joining portion located at a board edge side of the circuit board is relatively small. Then, variations in adhesion of the solder to the joining portion can be relatively small.

EMBODIMENTS FOR CARRYING OUT THE INVENTION

Embodiments of the present invention will be explained below with reference to the drawings.

Figure 1:
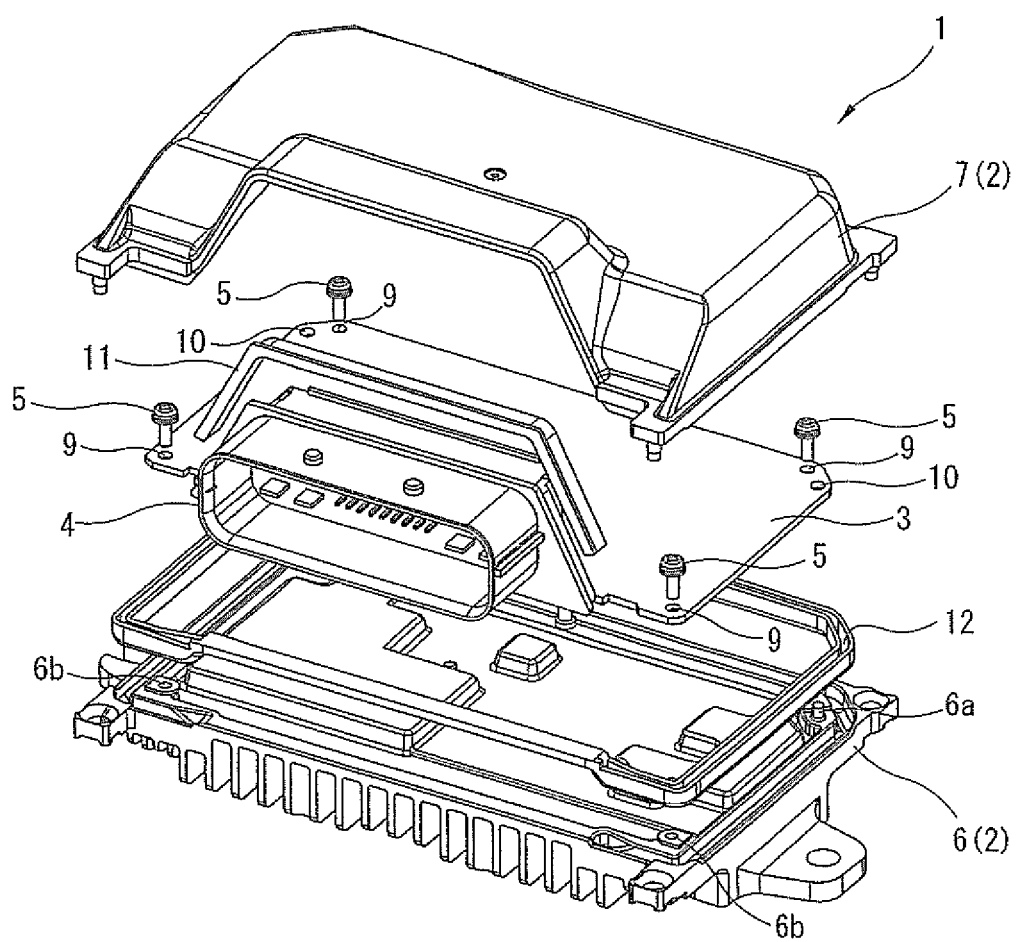
FIG. 1 is a perspective exploded view of an electronic control device according to the present invention.

FIG. 1 is a perspective exploded view of an electronic control device 1 according to the present invention. The electronic control device 1 is formed by mainly a hollow casing 2 having a flat rectangular parallelepiped, a circuit board 3 on which electronic components are mounted and a connector 4 fixed to the circuit board 3.

The casing 2 accommodates therein the circuit board 3. The casing 2 has a base portion 6 to which the circuit board 3 is fixed with board fixing screws 5 and a cover portion 7 which covers the circuit board 3 fixed to the base portion 6. The base portion 6 has positioning protrusions 6a formed so as to protrude for positioning of the circuit board 3 and screw holes 6b which the board fixing screws 5 are screwed into and fixed to. The base portion 6 is made of material having an excellent heat radiation. For instance, the base portion 6 is made of metal material such as aluminum and iron. The cover portion 7 is made of, for instance, resin material.

The circuit board 3 has a rectangular plate shape, and is fixed to the base portion 6 with the board fixing screws 5 at four corners of the circuit board 3. The circuit board 3 is sandwiched between the base portion 6 and the cover portion 7. The circuit board 3 is provided, at a board body having insulating nature, with conductor patterns (not shown), board fixing screw penetration holes 9 which the board fixing screws 5 penetrate and positioning protrusion penetration holes 10 into which the positioning protrusions 6a are inserted. The board body of the circuit board 3 is made of, for instance, glass epoxy resin.

The connector 4 is fixed to a board edge of the circuit board 3. The connector 4 electrically connects an external device to the casing 2 and the electronic components mounted on the circuit board 3.

A gap between the connector 4 and the cover portion 7 is sealed by a first seal member 11. A gap between the base portion 6 and the cover portion 7 is sealed by a second seal member 12. As the first seal member 11 and the second seal member 12, a gasket or a liquid gasket can be used. The first seal member 11 and the second seal member 12 are made of material such as rubber and silicon.

Figure 2:
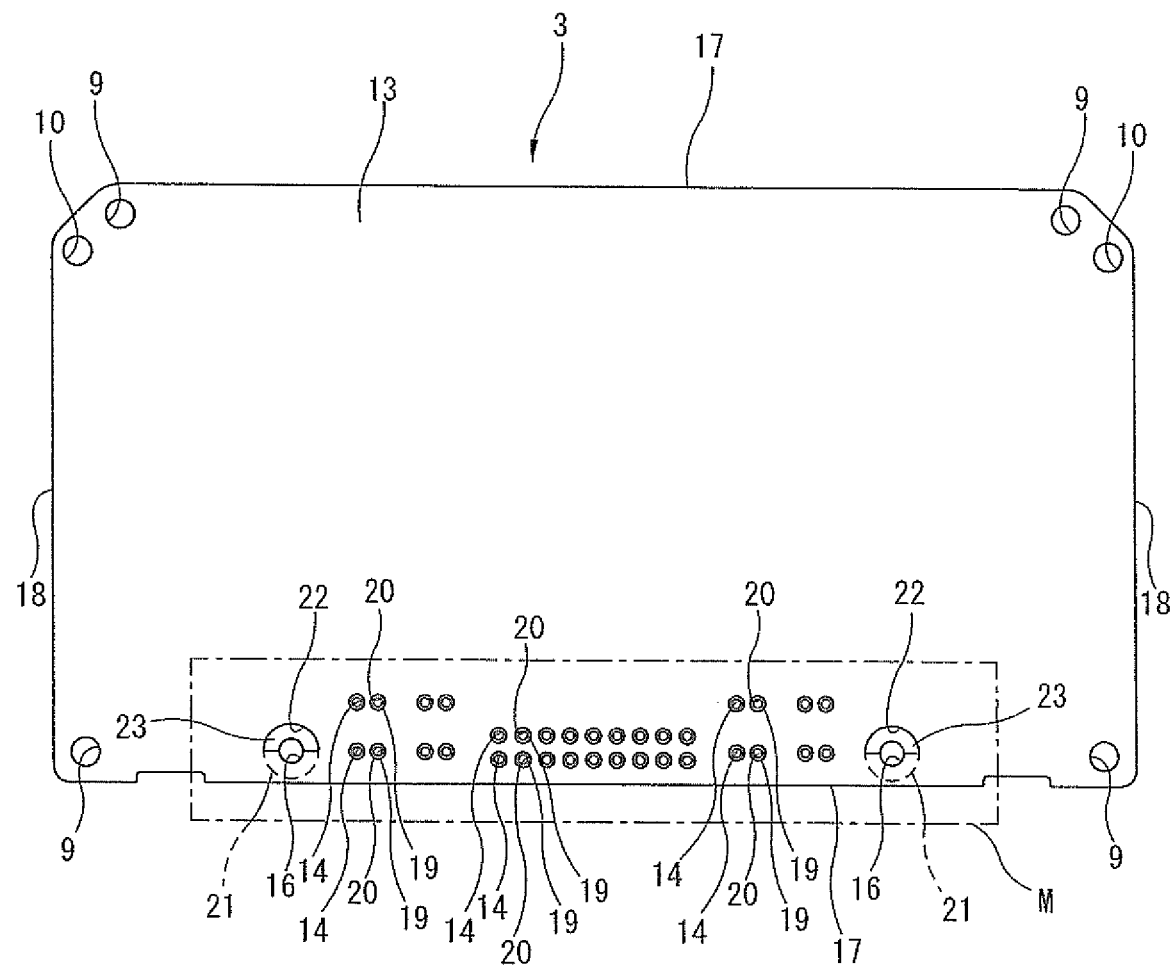
FIG. 2 is a plan view schematically showing a circuit board.

FIG. 2 is a plan view schematically showing the circuit board 3.

A surface of the circuit board 3 is covered with a resist layer 13 made of material having insulating nature. Besides having the board fixing screw penetration holes 9 and the positioning protrusion penetration holes 10, the circuit board 3 has a plurality of pin penetration holes 14 which pins (not shown) of the connector 4 penetrate and connector fixing screw penetration holes 16 which connector fixing screws 15 (described later) for fixing the connector 4 to the circuit board 3 penetrate. The connector fixing screw 15 corresponds to a fixing member. The connector fixing screw penetration hole 16 corresponds to a penetration hole. The connector fixing screw penetration hole 16 is formed so as to have a larger diameter than the pin penetration hole 14. The circuit board 3 has a pair of first board edges 17 and 17 that are located on opposite sides of the circuit board 3 and a pair of second board edges 18 and 18 that are located on opposite sides of the circuit board 3.

The pin penetration holes 14 are formed at a position adjacent to the first board edge 17. At an outer circumference of each pin penetration hole 14, an annular pin land 19 where the pin of the connector 4 is soldered is formed.

The pin land 19 is formed concentrically with the pin penetration hole 14. The pin land 19 is exposed by or through a resist layer circular opening 20 that is formed at the outer circumferential side of the pin penetration hole 14. The pin land 19 is formed so that its inside diameter is substantially the same as the pin penetration hole 14, and its outside diameter is larger than the pin penetration hole 14. The resist layer circular opening 20 is formed concentrically with the pin penetration hole 14 so as to have a larger diameter than the pin land 19.

The resist layer circular opening 20 is an opening that is formed on the resist layer 13. The pin land 19 is formed so as to be concentric with the pin penetration hole 14.

The connector fixing screw penetration holes 16 are provided one by one at both sides in an area which is adjacent to the first board edge 17 and in which the plurality of pin penetration holes 14 are provided. At an outer circumference of each connector fixing screw penetration hole 16, an annular screw land 21 as a land where a screw head of the connector fixing screw 15 can be soldered is formed.

The screw land 21 is formed concentrically with the connector fixing screw penetration hole 16. The screw land 21 is formed so that its diameter is large as compared with the pin land 19 and its area is large as compared with the pin land 19. Further, the screw land 21 is formed so that its inside diameter is substantially the same as the connector fixing screw penetration hole 16, and its outside diameter is larger than the connector fixing screw penetration hole 16. A part of the screw land 21 is exposed by or through a resist layer opening 22 that is formed at a circumference of the connector fixing screw penetration hole 16.

The resist layer opening 22 is an opening that is formed on the resist layer 13. A part, which is exposed by or through the resist layer opening 22, of the screw land 21 is a joining portion 23 where the connector fixing screw 15 can be soldered.

The pin land 19 and the screw land 21 are formed with conductive material to which solder can be joined or adhere, such as a copper foil. A thickness of each of the pin land 19 and the screw land 21 is thicker than the thin resist layer 13. Because of this, for instance, in a case where the screw land 21 is not formed into the annular shape, but the screw land 21 is provided only at a position corresponding to the resist layer opening 22, a step or a bump occurs at a circumference of the connector fixing screw 15, and there is a risk that this will adversely affect fixing of the connector 4 with the connector fixing screws 15.

However, the screw land 21 is formed into the annular shape at the circumference of the connector fixing screw 15. Therefore, when fixing the connector 4 to the circuit board 3 with the connector fixing screw 15, the screw head of the connector fixing screw 15 can contact the circumference of the connector fixing screw penetration hole 16 stably in a circumferential direction of a center axis of the connector fixing screw penetration hole 16.

Here, the number of the connector fixing screw penetration hole 16 is not limited to two. For instance, a plurality of connector fixing screw penetration holes 16 could be arranged along the first board edge 17 at both sides in the area in which the plurality of pin penetration holes are provided.

In FIG. 2, a rectangular area M enclosed by a dashed line indicates an area where a flow soldering is performed. That is, each of the pins of the connector 4 is soldered to the pin land 19 formed at a circumference of the pin penetration hole 14 and also each of the connector fixing screws 15 is soldered to the screw land 21 by flow soldering. For instance, the flow soldering of the connector 4 is performed by passing on jets of melting solder.

Figure 3:
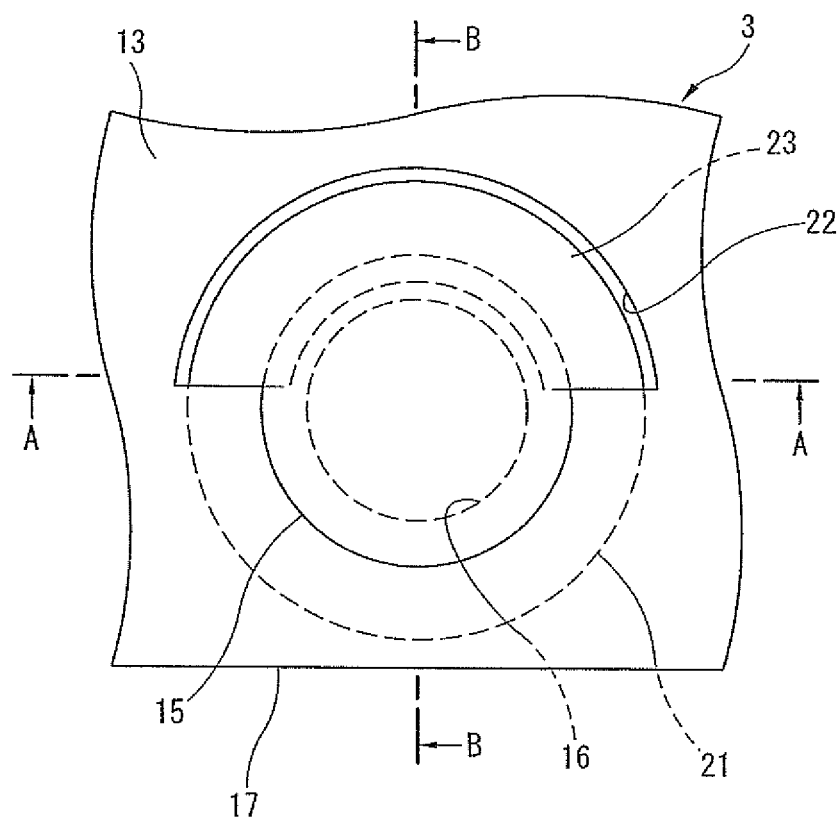
FIG. 3 is an enlarged plan view of an essential part of the circuit board of the electronic control device according to the present invention.

FIG. 3 is an enlarged plan view of an essential part of the circuit board 3 having undergone the flow soldering.

The circuit board 3 has the resist layer 13, the connector fixing screw penetration hole 16 and the screw land 21. Apart, which is exposed by or through the resist layer opening 22, of the screw land 21 is the joining portion 23, and the solder adheres to the joining portion 23 by flow soldering. The solder adheres to an entire surface of the screw head of the connector fixing screw 15. The solder adhering to the screw head of the connector fixing screw 15 continues to the solder adhering to the screw land 21 (the solder adhering to the screw head of the connector fixing screw 15 continuously extends or joined to the screw land 21). That is, the solder adhering to the screw head of the connector fixing screw 15 is fixed or joined to the screw land 21. In FIG. 3, a reference sign 17 denotes the first board edge.

Figure 4:
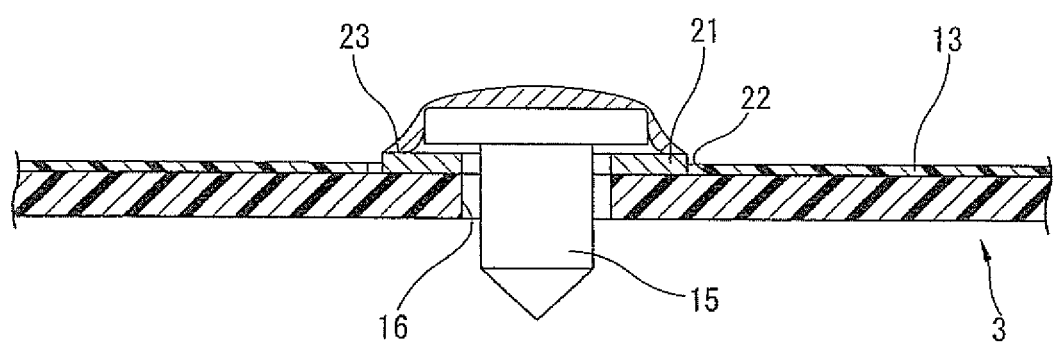
FIG. 4 is a sectional view taken along a line A-A of FIG. 3.

FIG. 4 is a sectional view taken along a line A-A of FIG. 3. That is, FIG. 4 is a sectional view of the essential part of the circuit board 3 having undergone the flow soldering.

The circuit board 3 has the connector fixing screw penetration hole 16, the resist layer 13 and the screw land 21. The resist layer 13 has the resist layer opening 22.

The solder adheres to the part, which is exposed by or through the resist layer opening 22, of the screw land 21 by flow soldering.

The connector fixing screw 15 is inserted into the connector fixing screw penetration hole 16. The solder adheres to the screw head of the connector fixing screw 15 by flow soldering. The solder adhering to the screw head of the connector fixing screw 15 continues to the solder adhering to the screw land 21 (the solder adhering to the screw head of the connector fixing screw 15 continuously extends or joined to the screw land 21).

Figure 5:
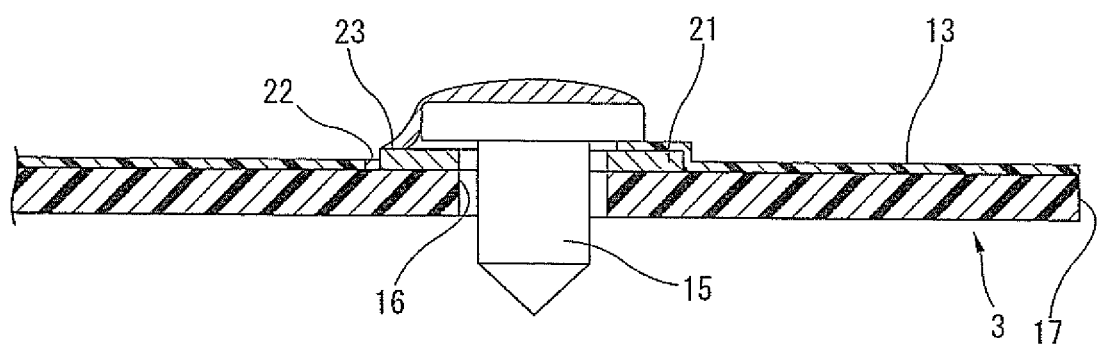
FIG. 5 is a sectional view taken along a line B-B of FIG. 3.

FIG. 5 is a sectional view taken along a line B-B of FIG. 3. That is, FIG. 5 is a sectional view of the essential part of the circuit board 3 having undergone the flow soldering.

The solder does not adhere to a part, which is covered with the resist layer 13, of the screw land 21 even though the flow soldering is performed. At the part, which is covered with the resist layer 13, of the screw land 21, the resist layer 13 is sandwiched between the screw head of the connector fixing screw 15 and the screw land 21. The reference sign 17 in FIG. 3 is the first board edge.

When the connector fixing screw 15 is soldered to the screw land 21 by flow soldering, looseness of the connector fixing screw 15 is suppressed by soldering. However, in the area M where the flow soldering is performed, there is a risk that the soldering jet will become more unstable toward the board edge side. That is, in the case of the flow soldering, due to an influence of the soldering jet, there is a tendency for adhesion of the solder at an inner side of the circuit board 3 to be more stable than that at the first board edge 17, which the connector fixing screw penetration hole 16 is close to, of the circuit board 3.

Therefore, the above-mentioned joining portion 23 is formed so that an area of the joining portion 23 located at the inner side of the circuit board 3 with respect to a center C1 of the connector fixing screw penetration hole 16 is larger than an area of the joining portion 23 located at an outer side of the circuit board 3 with respect to the center C1 of the connector fixing screw penetration hole 16. In other words, the joining portion 23 is formed so that the area of the joining portion 23 located at the first board edge side that is relatively away from the connector fixing screw penetration hole 16 is larger than the area of the joining portion 23 located at the first board edge side that is relatively close to the connector fixing screw penetration hole 16. That is, the resist layer opening 22 is formed so that an area of a part, where adhesion of the solder by flow soldering is more stable, of the screw land 21 is relatively large.

Figure 6:
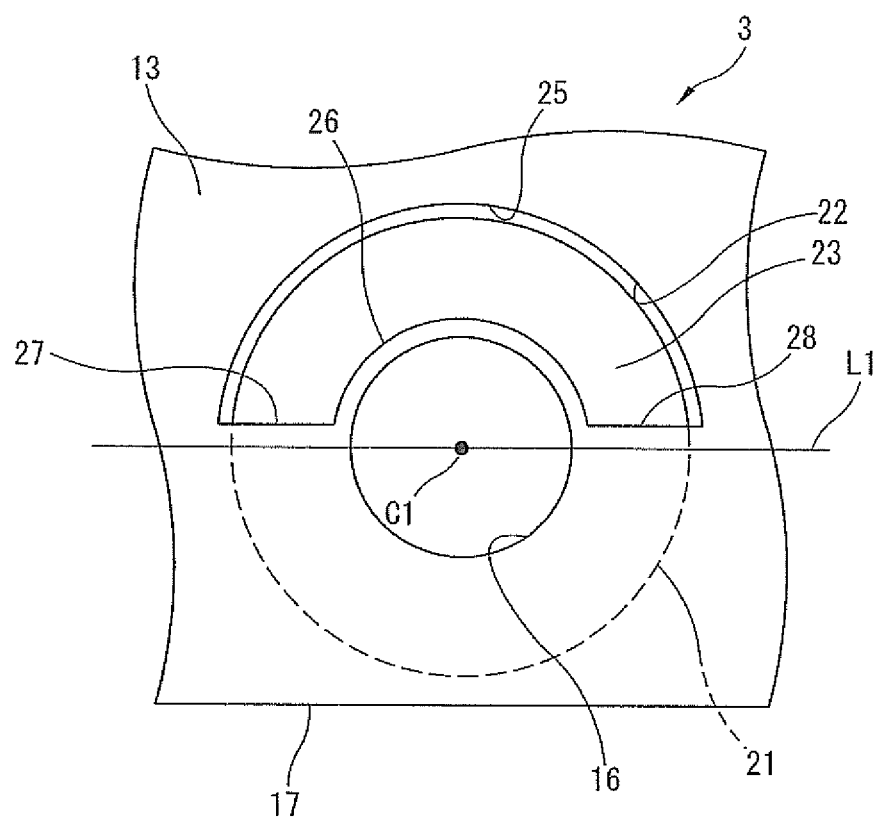
FIG. 6 is an enlarged plan view of an essential part of the circuit board according to a first embodiment of the present invention.

FIG. 6 is an enlarged plan view of an essential part of the circuit board 3 according to a first embodiment of the present invention. In the first embodiment, as shown in FIG. 6, the joining portion 23 is formed at the inner side of the circuit board 3 with respect to the center C1 of the connector fixing screw penetration hole 16. In other words, the joining portion 23 is formed at the first board edge side that is relatively away from the connector fixing screw penetration hole 16 with respect to a first reference line L1 that is parallel to the first board edge 17 of the circuit board 3 and passes through the center C1 of the connector fixing screw penetration hole 16.

More specifically, the joining portion 23 is formed so that an area of the joining portion 23 located at the inner side of the circuit board 3 with respect to the center C1 of the connector fixing screw penetration hole 16 is larger than an area of the joining portion 23 located at the outer side of the circuit board 3 with respect to the center C1 of the connector fixing screw penetration hole 16. In other words, the joining portion 23 is formed so that an area of the joining portion 23 located at a middle side between the pair of first board edges 17 and 17 with respect to the first reference line L1 is larger than an area of the joining portion 23 located at the first board edge side that is close to the connector fixing screw penetration hole 16 with respect to the first reference line L1.

To put it another way, the joining portion 23 is formed so that the area of the joining portion 23 located at the first board edge side that is relatively away from the connector fixing screw penetration hole 16 is larger than the area of the joining portion 23 located at the first board edge side that is relatively close to the connector fixing screw penetration hole 16.

More specifically, the joining portion 23 is formed so that a portion of the joining portion 23 located at the inner side of the circuit board 3 with respect to the center C1 of the connector fixing screw penetration hole 16 and facing to an outer circumferential edge of the connector fixing screw penetration hole 16 is longer than a portion of the joining portion 23 located at the outer side of the circuit board 3 with respect to the center C1 of the connector fixing screw penetration hole 16 and facing to the outer circumferential edge of the connector fixing screw penetration hole 16. In other words, the joining portion 23 is formed so that a portion of the joining portion 23 located at the first board edge side that is relatively away from the connector fixing screw penetration hole 16 when viewed from the center C1 of the connector fixing screw penetration hole 16 and facing to the outer circumferential edge of the connector fixing screw penetration hole 16 is longer than a portion of the joining portion 23 located at the first board edge side that is relatively close to the connector fixing screw penetration hole 16 and facing to the outer circumferential edge of the connector fixing screw penetration hole 16. The portion, facing to the outer circumferential edge of the connector fixing screw penetration hole 16, of the joining portion 23 is an inner circumferential edge of the joining portion 23.

Then, the joining portion 23 is formed so that end portions of the joining portion 23 in the circumferential direction of the center axis of the connector fixing screw penetration hole 16 are parallel to and close to the first reference line L1.

The resist layer opening 22 has an outer side curve 25, an inner side curve 26, a first end side 27 that connects one end of the outer side curve 25 and one end of the inner side curve 26 and a second end side 28 that connects the other end of the outer side curve 25 and the other end of the inner side curve 26.

The outer side curve 25 has an arc shape. The outer side curve 25 is formed so as to be located outside the screw land 21. The inner side curve 26 has an arc shape. The inner side curve 26 is formed so as to be located at an inner side with respect to the outer side curve 25 in a radial direction of the center axis of the connector fixing screw penetration hole 16 and located at an outer side with respect to an opening of the connector fixing screw penetration hole 16.

The outer side curve 25 and the inner side curve 26 are formed at the inner side of the circuit board 3 with respect to the first reference line L1. In other words, the outer side curve 25 and the inner side curve 26 are formed at the first board edge side that is relatively away from the connector fixing screw penetration hole 16 with respect to the first reference line L1. A center of curvature of each of the outer side curve 25 and the inner side curve 26 is the center C1 of the connector fixing screw penetration hole 16.

The first end side 27 and the second end side 28 each have a linear shape. The first end side 27 and the second end side 28 are formed at the inner side of the circuit board 3 with respect to the center C1 of the connector fixing screw penetration hole 16. In other words, the first end side 27 and the second end side 28 have the linear shape and are formed at the first board edge side that is relatively away from the connector fixing screw penetration hole 16 with respect to the first reference line L1. More specifically, the first end side 27 and the second end side 28 are formed at respective positions that are adjacent to the first reference line L1.

Further, the first end side 27 and the second end side 28 are formed so as to extend across a part of the screw land 21 and be parallel to the first reference line L1.

Therefore, an overall shape of the resist layer opening 22 of the first embodiment is curved like the arc shape so as to overlap the screw land 21. Here, an opening area of the resist layer opening 22 is larger than an area of the joining portion 23. This is because the outer side curve 25 is located outside the screw land 21.

Then, at least a portion, located at the inner side of the circuit board 3 with respect to the center C1 of the connector fixing screw penetration hole 16, of the connector fixing screw 15 is fixed or joined to the joining portion 23 by soldering. In other words, at least a portion, located at the first board edge side that is relatively away from the connector fixing screw penetration hole 16, of the connector fixing screw 15 is fixed or joined to the joining portion 23 by soldering.

As described above, in the first embodiment of the present invention, the joining portion 23 is formed so that the area of the joining portion 23 located at the inner side of the circuit board 3 with respect to the center C1 of the connector fixing screw penetration hole 16 is relatively large. Therefore, the area of the joining portion 23 located at the first board edge side that is close to the connector fixing screw penetration hole 16 is relatively small, then variations in adhesion of the solder to the joining portion 23 can be relatively small.

That is, when soldering the connector fixing screw 15 to the circumference of the connector fixing screw penetration hole 16 by flow soldering described above, it is possible to firmly fix or join the connector fixing screw 15 to the circuit board 3 by the solder that stably adheres them.

Further, the area of a part, where adhesion of the solder is more stable, of the joining portion 23 is relatively large. It is thus possible to suppress an occurrence of so-called "red eye" which means that a part where the solder does not adhere appears on the joining portion 23 when performing the flow soldering.

Furthermore, the solder adhering to the screw head of the connector fixing screw 15 adheres to the joining portion 23 located at the inner side of the circuit board 3 with respect to the center C1 of the connector fixing screw penetration hole 16 by soldering. It is therefore possible to suppress a fall of the solder adhering to the screw head of the connector fixing screw 15.

Other embodiments of the present invention will be explained below. The same element or component as that of the first embodiment is denoted by the same reference sign, and its explanation will be omitted.

Figure 7:
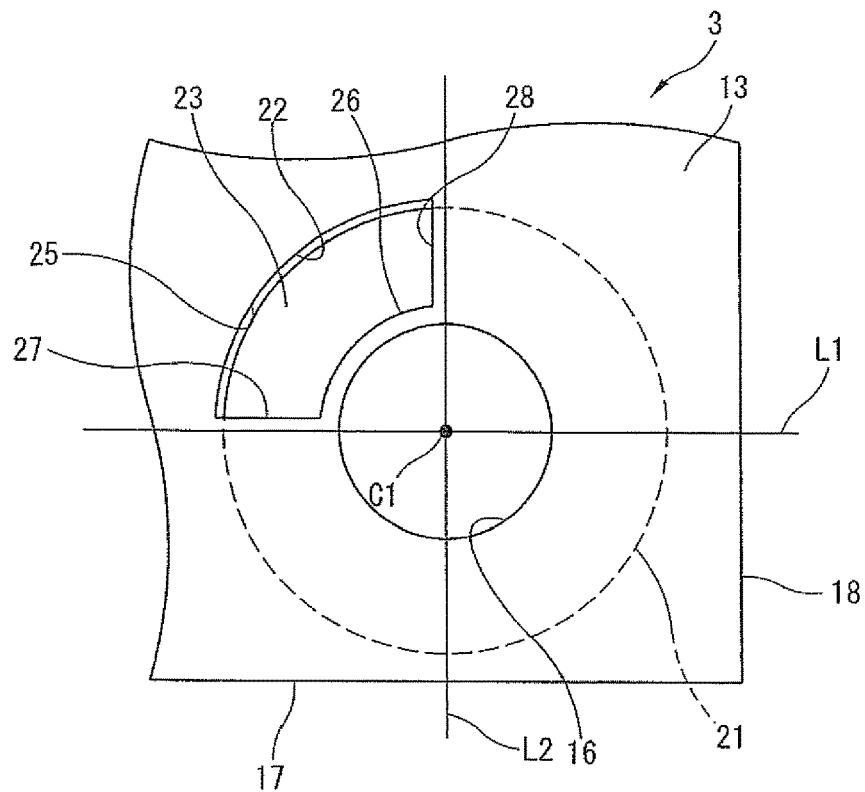
FIG. 7 is an enlarged plan view of an essential part of the circuit board according to a second embodiment of the present invention.

A second embodiment will be explained with reference to FIG. 7. FIG. 7 is an enlarged plan view of an essential part of the circuit board 3 according to the second embodiment of the present invention. This second embodiment has substantially the same configuration as that of the first embodiment. Also in the second embodiment, the joining portion 23 is formed so that the area of the joining portion 23 located at the inner side of the circuit board 3 with respect to the center C1 of the connector fixing screw penetration hole 16 is relatively large.

However, the joining portion 23 is formed only at a portion located at a middle side between the pair of first board edges with respect to the center C1 of the connector fixing screw penetration hole 16 and also located at a middle side between the pair of second board edges with respect to the center C1 of the connector fixing screw penetration hole 16. In other words, the joining portion 23 is formed at the first board edge side that is relatively away from the connector fixing screw penetration hole 16 with respect to the first reference line L1 and also at a second board edge side that is relatively away from the connector fixing screw penetration hole 16 with respect to a second reference line L2 that is parallel to the second board edge 18 of the circuit board 3 and passes through the center C1 of the connector fixing screw penetration hole 16.

More specifically, the joining portion 23 is formed so that an area of the joining portion 23 located at the middle side between the pair of first board edges with respect to the center C1 of the connector fixing screw penetration hole 16 and also located at the middle side between the pair of second board edges with respect to the center C1 of the connector fixing screw penetration hole 16 is larger than the other area of the joining portion 23. "The other area" of the joining portion 23 is an area obtained by the sum of an area located at the first board edge side that is close to the connector fixing screw penetration hole 16 with respect to the center C1 of the connector fixing screw penetration hole 16 and an area located at a second board edge side that is close to the connector fixing screw penetration hole 16 with respect to the center C1 of the connector fixing screw penetration hole 16 and also located at the middle side between the pair of first board edges with respect to the center C1 of the connector fixing screw penetration hole 16.

To put it another way, the joining portion 23 of the second embodiment is formed so that an area of the joining portion 23 located at the middle side between the pair of first board edges with respect to the first reference line L1 and also located at the middle side between the pair of second board edges with respect to the second reference line L2 is larger than the other area of the joining portion 23. "The other area" of the joining portion 23 is an area obtained by the sum of an area located at the first board edge side that is close to the connector fixing screw penetration hole 16 with respect to the first reference line L1 and an area located at the second board edge side that is close to the connector fixing screw penetration hole 16 also located at the middle side between the pair of first board edges with respect to the first reference line L1.

Then, the joining portion 23 of the second embodiment is formed so that one end portion of the joining portion 23 in the circumferential direction of the center axis of the connector fixing screw penetration hole 16 is adjacent to and parallel to the first reference line L1, and the other end portion of the joining portion 23 in the circumferential direction of the center axis of the connector fixing screw penetration hole 16 is adjacent to and parallel to the second reference line L2.

The resist layer opening 22 of the second embodiment is formed only at the portion located at the middle side between the pair of first board edges with respect to the center C1 of the connector fixing screw penetration hole 16 and also located at the middle side between the pair of second board edges with respect to the center C1 of the connector fixing screw penetration hole 16.

The outer side curve 25 and the inner side curve 26 of the resist layer opening 22 of the second embodiment are formed only at the portion located at the middle side between the pair of first board edges with respect to the center C1 of the connector fixing screw penetration hole 16 and also located at the middle side between the pair of second board edges with respect to the center C1 of the connector fixing screw penetration hole 16. In other words, the outer side curve 25 and the inner side curve 26 are formed only at the portion located at the first board edge side that is relatively away from the connector fixing screw penetration hole 16 with respect to the first reference line L1 and also located at the second board edge side that is relatively away from the connector fixing screw penetration hole 16 with respect to the second reference line L2.

The first end side 27 of the second embodiment is formed at the middle side between the pair of first board edges with respect to the center C1 of the connector fixing screw penetration hole 16. In other words, the first end side 27 of the second embodiment is formed at the first board edge side that is relatively away from the connector fixing screw penetration hole 16 with respect to the first reference line L1. More specifically, the first end side 27 of the second embodiment is formed so as to be adjacent to and parallel to the first reference line L1.

The second end side 28 of the second embodiment is formed at the middle side between the pair of second board edges with respect to the center C1 of the connector fixing screw penetration hole 16. In other words, the second end side 28 of the second embodiment is formed at the second board edge side that is relatively away from the connector fixing screw penetration hole 16 with respect to the second reference line L2. More specifically, the second end side 28 of the second embodiment is formed so as to be adjacent to and parallel to the second reference line L2.

In FIG. 7, a reference sign 17 denotes the first board edge, and a reference sign 18 denotes the second board edge. A reference sign 21 in FIG. 7 denotes the screw land.

The second embodiment as described above also has substantially the same working and effect as those of the first embodiment.

In addition, in the second embodiment, the joining portion 23 can be formed with consideration given to the soldering jet at the second board edge side. That is, an area of a part, where adhesion of the solder by flow soldering is relatively stable, of the joining portion 23 is larger. Accordingly, in the second embodiment, it is possible to further suppress the occurrence of the red eye on the joining portion 23 when performing the flow soldering, as compared with the first embodiment.

Figure 8:
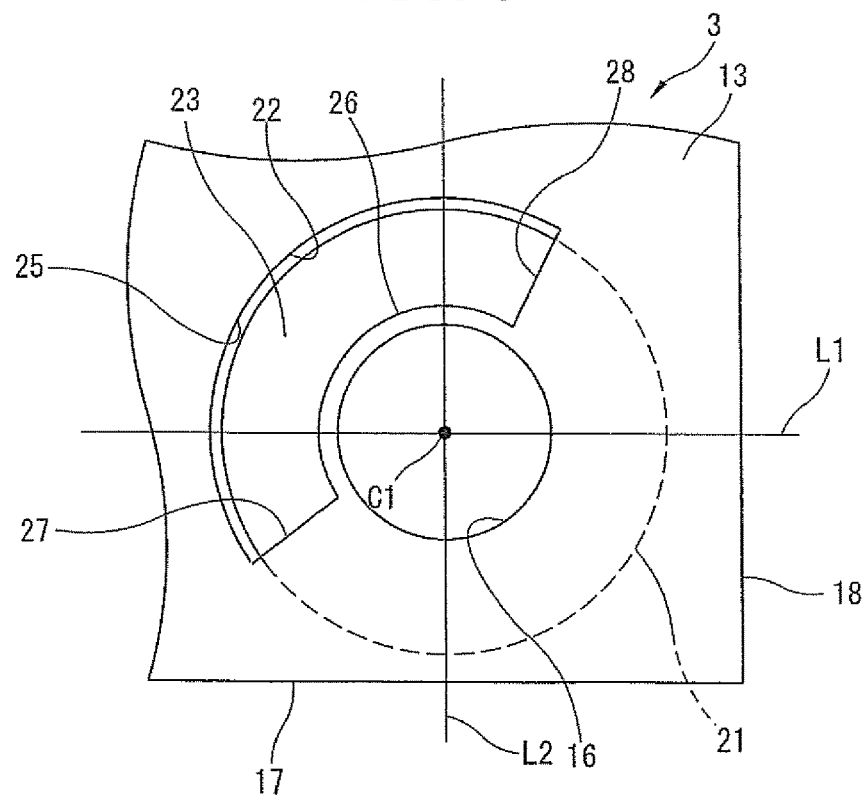
FIG. 8 is an enlarged plan view of an essential part of the circuit board according to a third embodiment of the present invention.

A third embodiment will be explained with reference to FIG. 8. FIG. 8 is an enlarged plan view of an essential part of the circuit board 3 according to the third embodiment of the present invention. This third embodiment has substantially the same configuration as that of the first embodiment. Also in the third embodiment, the joining portion 23 is formed so that the area of the joining portion 23 located at the inner side of the circuit board 3 with respect to the center C1 of the connector fixing screw penetration hole 16 is relatively large.

However, the joining portion 23 of the third embodiment is formed so that an area of the joining portion 23 located at a middle side between the pair of first board edges with respect to the center C1 of the connector fixing screw penetration hole 16 and also located at a middle side between the pair of second board edges with respect to the center C1 of the connector fixing screw penetration hole 16 is larger than the other area of the joining portion 23. "The other area" of the joining portion 23 is an area obtained by the sum of an area located at the first board edge side that is close to the connector fixing screw penetration hole 16 with respect to the center C1 of the connector fixing screw penetration hole 16 and an area located at the second board edge side that is close to the connector fixing screw penetration hole 16 with respect to the center C1 of the connector fixing screw penetration hole 16 and also located at the middle side between the pair of first board edges with respect to the center C1 of the connector fixing screw penetration hole 16.

More specifically, the joining portion 23 of the third embodiment is formed so that an area of the joining portion 23 located at the middle side between the pair of first board edges with respect to the first reference line L1 and also located at the middle side between the pair of second board edges with respect to the second reference line L2 that is parallel to the second board edge 18 of the circuit board 3 and passes through the center C1 of the connector fixing screw penetration hole 16 is larger than the other area of the joining portion 23. "The other area" of the joining portion 23 is an area obtained by the sum of an area located at the first board edge side that is close to the connector fixing screw penetration hole 16 with respect to the first reference line L1 and an area located at the second board edge side that is close to the connector fixing screw penetration hole 16 also located at the middle side between the pair of first board edges with respect to the first reference line L1.

Then, the joining portion 23 of the third embodiment is formed so that end portions of the joining portion 23 in the circumferential direction of the center axis of the connector fixing screw penetration hole 16 extend along the radial direction of the center axis of the connector fixing screw penetration hole 16.

The resist layer opening 22 of the third embodiment is formed so that an area of the resist layer opening 22 located at a middle side between the pair of first board edges with respect to the center C1 of the connector fixing screw penetration hole 16 and also located at a middle side between the pair of second board edges with respect to the center C1 of the connector fixing screw penetration hole 16 is larger than the other area of the resist layer opening 22. "The other area" of the resist layer opening 22 is an area obtained by the sum of an area located at the first board edge side that is close to the connector fixing screw penetration hole 16 with respect to the center C1 of the connector fixing screw penetration hole 16 and an area located at the second board edge side that is close to the connector fixing screw penetration hole 16 with respect to the center C1 of the connector fixing screw penetration hole 16 and also located at the middle side between the pair of first board edges with respect to the center C1 of the connector fixing screw penetration hole 16.

The outer side curve 25 of the third embodiment is formed so that a length of the outer side curve 25 located at a middle side between the pair of first board edges with respect to the center C1 of the connector fixing screw penetration hole 16 and also located at a middle side between the pair of second board edges with respect to the center C1 of the connector fixing screw penetration hole 16 is longer than the other length of the outer side curve 25. "The other length" of the outer side curve 25 is a length obtained by the sum of a length located at the first board edge side that is close to the connector fixing screw penetration hole 16 with respect to the center C1 of the connector fixing screw penetration hole 16 and a length located at the second board edge side that is close to the connector fixing screw penetration hole 16 with respect to the center C1 of the connector fixing screw penetration hole 16 and also located at the middle side between the pair of first board edges with respect to the center C1 of the connector fixing screw penetration hole 16.

The inner side curve 26 of the third embodiment is formed so that a length of the inner side curve 26 located at a middle side between the pair of first board edges with respect to the center C1 of the connector fixing screw penetration hole 16 and also located at a middle side between the pair of second board edges with respect to the center C1 of the connector fixing screw penetration hole 16 is longer than the other length of the inner side curve 26. "The other length" of the inner side curve 26 is a length obtained by the sum of a length located at the first board edge side that is close to the connector fixing screw penetration hole 16 with respect to the center C1 of the connector fixing screw penetration hole 16 and a length located at the second board edge side that is close to the connector fixing screw penetration hole 16 with respect to the center C1 of the connector fixing screw penetration hole 16 and also located at the middle side between the pair of first board edges with respect to the center C1 of the connector fixing screw penetration hole 16.

The first end side 27 of the third embodiment is formed at the first board edge side that is close to the connector fixing screw penetration hole 16 with respect to the first reference line L1. The second end side 28 of the third embodiment is formed at the second board edge side that is close to the connector fixing screw penetration hole 16 with respect to the second reference line L2.

The first end side 27 and the second end side 28 of the third embodiment are each formed so as to extend along the radial direction of the center axis of the connector fixing screw penetration hole 16.

In FIG. 8, a reference sign 17 denotes the first board edge. A reference sign 21 in FIG. 8 denotes the screw land.

The third embodiment as described above also has substantially the same working and effect as those of the first embodiment.

In addition, in the third embodiment, the joining portion 23 can be formed with consideration given to the soldering jet at the second board edge side. That is, an area of a part, where adhesion of the solder by flow soldering is relatively stable, of the joining portion 23 is larger. Accordingly, in the third embodiment, it is possible to further suppress the occurrence of the red eye on the joining portion 23 when performing the flow soldering, as compared with the first embodiment.

Figure 9:
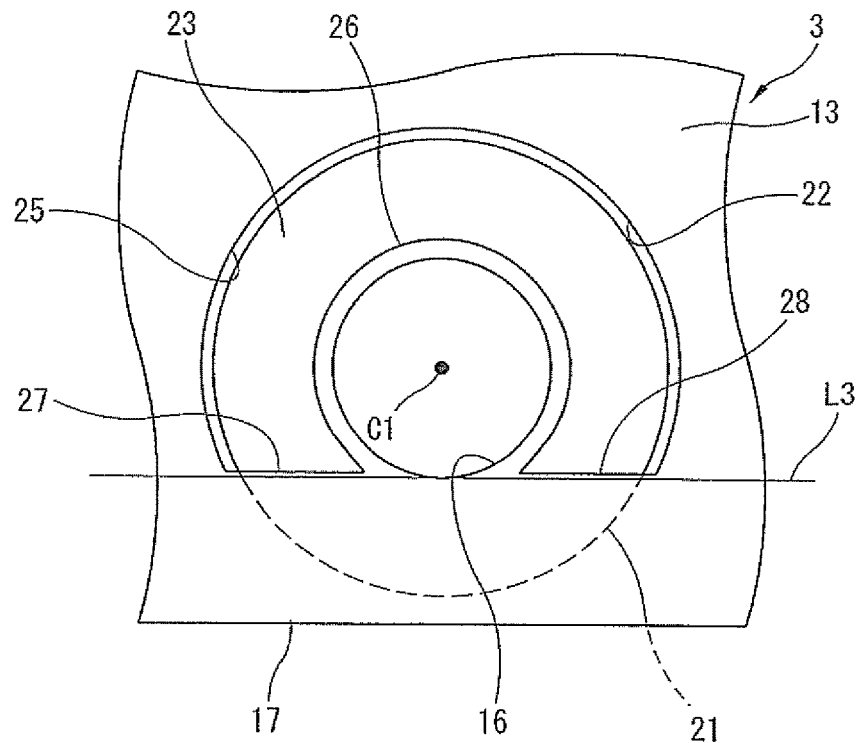
FIG. 9 is an enlarged plan view of an essential part of the circuit board according to a fourth embodiment of the present invention.

A fourth embodiment will be explained with reference to FIG. 9. FIG. 9 is an enlarged plan view of an essential part of the circuit board 3 according to the fourth embodiment of the present invention. This fourth embodiment has substantially the same configuration as that of the first embodiment. Also in the fourth embodiment, the joining portion 23 is formed so that the area of the joining portion 23 located at the inner side of the circuit board 3 with respect to the center C1 of the connector fixing screw penetration hole 16 is relatively large.

However, the joining portion 23 of the fourth embodiment is formed so as to be located at the inner side of the circuit board 3 with respect to a portion, positioned closest to the edge (an outer edge) of the circuit board 3, of the outer circumference of connector fixing screw penetration hole 16. In other words, the joining portion 23 of the fourth embodiment is formed at the first board edge side that is relatively away from the connector fixing screw penetration hole 16 with respect to the portion, positioned closest to the edge of the circuit board 3, of the outer circumference of the connector fixing screw penetration hole 16.

More specifically, the joining portion 23 of the fourth embodiment is formed at the first board edge side that is relatively away from the connector fixing screw penetration hole 16 with respect to a third reference line L3 that is parallel to the first board edge 17 of the circuit board 3 and passes through the portion, positioned closest to the edge of the first board edge 17, of the connector fixing screw penetration hole 16.

Then, the joining portion 23 of the fourth embodiment is formed so that end portions of the joining portion 23 in the circumferential direction of the center axis of the connector fixing screw penetration hole 16 are parallel to the first board edge 17. In other words, the joining portion 23 of the fourth embodiment is formed so that the end portions of the joining portion 23 in the circumferential direction of the center axis of the connector fixing screw penetration hole 16 are adjacent to and parallel to the third reference line L3.

The resist layer opening 22 of the fourth embodiment is formed so as to be located at the inner side of the circuit board 3 with respect to the portion, positioned closest to the edge of the circuit board 3, of the outer circumference of connector fixing screw penetration hole 16.

That is, the outer side curve 25, the inner side curve 26, the first end side 27 and the second end side 28 of the fourth embodiment are formed so as to be located at the inner side of the circuit board 3 with respect to the portion, positioned closest to the edge of the circuit board 3, of the outer circumference of connector fixing screw penetration hole 16. In other words, the outer side curve 25, the inner side curve 26, the first end side 27 and the second end side 28 of the fourth embodiment are formed at the first board edge side that is relatively away from the connector fixing screw penetration hole 16 with respect to the portion, positioned closest to the edge of the circuit board 3, of the outer circumference of connector fixing screw penetration hole 16.

More specifically, the outer side curve 25, the inner side curve 26, the first end side 27 and the second end side 28 of the fourth embodiment are formed at the first board edge side that is relatively away from the connector fixing screw penetration hole 16 with respect to the third reference line L3.

The first end side 27 and the second end side 28 of the fourth embodiment are each formed so as to be parallel to the third reference line L3. Further, the first end side 27 and the second end side 28 of the fourth embodiment are formed at respective positions that are adjacent to the third reference line L3.

In FIG. 9, a reference sign 21 denotes the screw land.

The fourth embodiment as described above also has substantially the same working and effect as those of the first embodiment.

Figure 10:
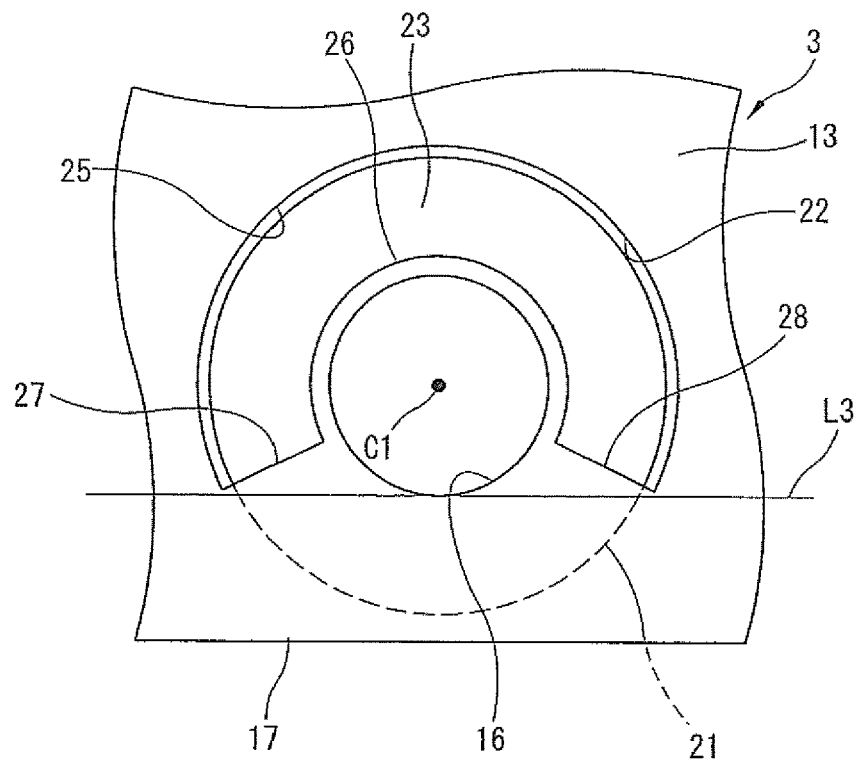
FIG. 10 is an enlarged plan view of an essential part of the circuit board according to a fifth embodiment of the present invention.

A fifth embodiment will be explained with reference to FIG. 10. FIG. 10 is an enlarged plan view of an essential part of the circuit board 3 according to the fifth embodiment of the present invention. This fifth embodiment has substantially the same configuration as that of the first embodiment. Also in the fifth embodiment, the joining portion 23 is formed so that the area of the joining portion 23 located at the inner side of the circuit board 3 with respect to the center C1 of the connector fixing screw penetration hole 16 is relatively large.

However, the joining portion 23 of the fifth embodiment is formed so as to be located at the inner side of the circuit board 3 with respect to the portion, positioned closest to the edge (the outer edge) of the circuit board 3, of the outer circumference of connector fixing screw penetration hole 16. In other words, the joining portion 23 of the fifth embodiment is formed at the first board edge side that is relatively away from the connector fixing screw penetration hole 16 with respect to the portion, positioned closest to the edge of the circuit board 3, of the outer circumference of connector fixing screw penetration hole 16.

More specifically, the joining portion 23 of the fifth embodiment is formed at the first board edge side that is relatively away from the connector fixing screw penetration hole 16 with respect to the third reference line L3 that is parallel to the first board edge 17 of the circuit board 3 and passes through the portion, positioned closest to the edge of the first board edge 17, of the connector fixing screw penetration hole 16.

Then, the joining portion 23 of the fifth embodiment is formed so that end portions of the joining portion 23 in the circumferential direction of the center axis of the connector fixing screw penetration hole 16 are adjacent to the third reference line L3 and extend along the radial direction of the center axis of the connector fixing screw penetration hole 16.

The resist layer opening 22 of the fifth embodiment is formed so as to be located at the inner side of the circuit board 3 with respect to the portion, positioned closest to the edge of the circuit board 3, of the outer circumference of connector fixing screw penetration hole 16.

That is, the outer side curve 25, the inner side curve 26, the first end side 27 and the second end side 28 of the fifth embodiment are formed so as to be located at the inner side of the circuit board 3 with respect to the portion, positioned closest to the edge of the circuit board 3, of the outer circumference of connector fixing screw penetration hole 16. In other words, the outer side curve 25, the inner side curve 26, the first end side 27 and the second end side 28 of the fifth embodiment are formed at the first board edge side that is relatively away from the connector fixing screw penetration hole 16 with respect to the portion, positioned closest to the edge of the circuit board 3, of the outer circumference of connector fixing screw penetration hole 16.

More specifically, the outer side curve 25, the inner side curve 26, the first end side 27 and the second end side 28 of the fifth embodiment are formed at the first board edge side that is relatively away from the connector fixing screw penetration hole 16 with respect to the third reference line L3.

The first end side 27 and the second end side 28 of the fifth embodiment are each formed so as to extend along the radial direction of the center axis of the connector fixing screw penetration hole 16. Further, the first end side 27 and the second end side 28 of the fifth embodiment are formed at respective positions that are adjacent to the third reference line L3.

In FIG. 10, a reference sign 21 denotes the screw land.

The fifth embodiment as described above also has substantially the same working and effect as those of the first embodiment.

Figure 11:
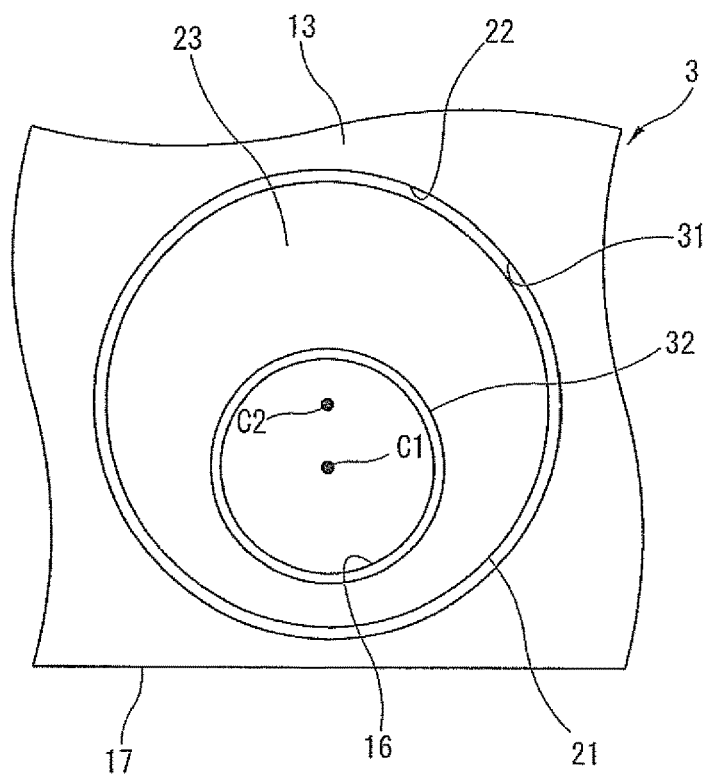
FIG. 11 is an enlarged plan view of an essential part of the circuit board according to a sixth embodiment of the present invention.

A sixth embodiment will be explained with reference to FIG. 11. FIG. 11 is an enlarged plan view of an essential part of the circuit board 3 according to the sixth embodiment of the present invention. This sixth embodiment has substantially the same configuration as that of the first embodiment. Also in the sixth embodiment, the joining portion 23 is formed so that the area of the joining portion 23 located at the inner side of the circuit board 3 with respect to the center C1 of the connector fixing screw penetration hole 16 is relatively large.

However, in the sixth embodiment, a center C2 of the screw land 21 is offset from the center C1 of the connector fixing screw penetration hole 16 toward the inner side of the circuit board 3. In other words, the center C2 of the screw land 21 is formed at a position that is shifted from the center C1 of the connector fixing screw penetration hole 16 toward the first board edge side that is relatively away from the connector fixing screw penetration hole 16. The center C2 of the screw land 21 is a center of an outside shape (an outside diameter) of the screw land 21.

The resist layer opening 22 of the sixth embodiment has an outer side circle 31 whose diameter is larger than the screw land 21 and an inner side circle 32 whose diameter is smaller than the outer side circle 31 and larger than the connector fixing screw penetration hole 16.

The outer side circle 31 is formed so as to be offset with respect to the center C1 of the connector fixing screw penetration hole 16 toward the inner side of the circuit board 3. In other words, the outer side circle 31 is formed so that its center is offset from the center C1 of the connector fixing screw penetration hole 16 toward the first board edge side that is relatively away from the connector fixing screw penetration hole 16. The center of the outer side circle 31 is a center of the resist layer opening 22, and coincides with the center C2 of the screw land 21.

The inner side circle 32 is formed so as to be concentric about the center C1 of the connector fixing screw penetration hole 16.

That is, the resist layer opening 22 of the sixth embodiment is formed so that its center is offset from the center C1 of the connector fixing screw penetration hole 16 toward the inner side of the circuit board 3. In other words, the resist layer opening 22 of the sixth embodiment is formed so that its center is offset from the center C1 of the connector fixing screw penetration hole 16 toward the first board edge side that is relatively away from the connector fixing screw penetration hole 16.

The joining portion 23 of the sixth embodiment has a circular shape whose outside diameter is larger than the connector fixing screw penetration hole 16. The joining portion 23 of the sixth embodiment is formed so that its center is offset from the center C1 of the connector fixing screw penetration hole 16 toward the inner side of the circuit board 3. In other words, the joining portion 23 of the sixth embodiment is formed so that its center is offset from the center C1 of the connector fixing screw penetration hole 16 toward the first board edge side that is relatively away from the connector fixing screw penetration hole 16.

In FIG. 11, a reference sign 17 denotes the first board edge.

The sixth embodiment as described above also has substantially the same working and effect as those of the first embodiment.

Figure 12:
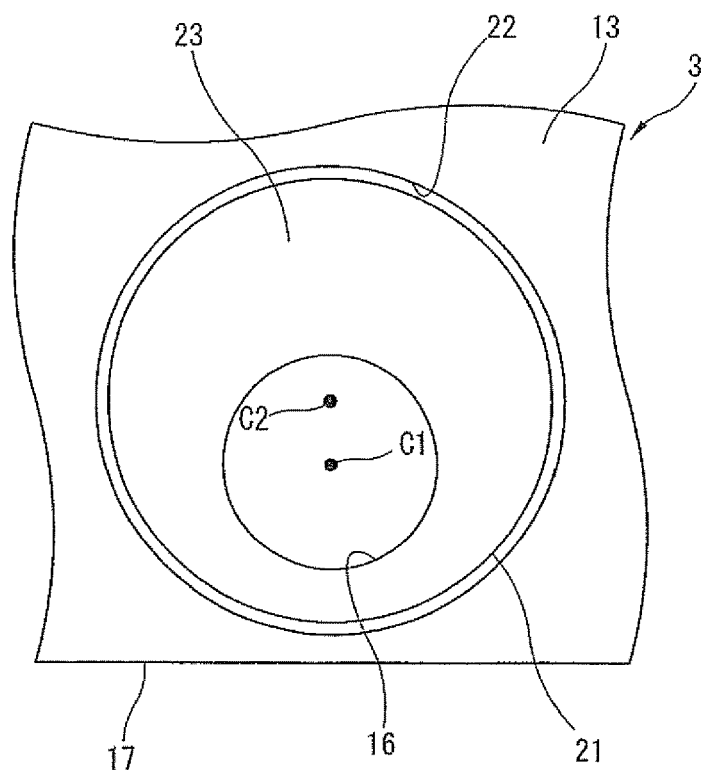
FIG. 12 is an enlarged plan view of an essential part of the circuit board according to a seventh embodiment of the present invention.

A seventh embodiment will be explained with reference to FIG. 12. FIG. 12 is an enlarged plan view of an essential part of the circuit board 3 according to the seventh embodiment of the present invention. This seventh embodiment has substantially the same configuration as that of the first embodiment. Also in the seventh embodiment, the joining portion 23 is formed so that the area of the joining portion 23 located at the inner side of the circuit board 3 with respect to the center C1 of the connector fixing screw penetration hole 16 is relatively large.

However, in the seventh embodiment, a center C2 of the screw land 21 is offset from the center C1 of the connector fixing screw penetration hole 16 toward the inner side of the circuit board 3. In other words, the center C2 of the screw land 21 is formed at a position that is shifted from the center C1 of the connector fixing screw penetration hole 16 toward the first board edge side that is relatively away from the connector fixing screw penetration hole 16. The center C2 of the screw land 21 is a center of an outside shape (an outside diameter) of the screw land 21.

The resist layer opening 22 of the seventh embodiment is a circular opening whose diameter is larger than the screw land 21. The resist layer opening 22 of the seventh embodiment is formed so that all of the screw land 21 is exposed. That is, the joining portion 23 of the seventh embodiment is the screw land 21.

The resist layer opening 22 of the seventh embodiment is formed so as to be offset with respect to the center C1 of the connector fixing screw penetration hole 16 toward the inner side of the circuit board 3. In other words, the resist layer opening 22 of the seventh embodiment is formed so that its center is offset from the center C1 of the connector fixing screw penetration hole 16 toward the first board edge side that is relatively away from the connector fixing screw penetration hole 16.

The resist layer opening 22 of the seventh embodiment is formed so that its center coincides with the center C2 of the screw land 21.

The joining portion 23 of the seventh embodiment has a circular shape whose outside diameter is larger than the connector fixing screw penetration hole 16. The joining portion 23 of the seventh embodiment is formed so that its center is offset from the center C1 of the connector fixing screw penetration hole 16 toward the inner side of the circuit board 3. In other words, the joining portion 23 of the seventh embodiment is formed so that its center is offset from the center C1 of the connector fixing screw penetration hole 16 toward the first board edge side that is relatively away from the connector fixing screw penetration hole 16.

In FIG. 12, a reference sign 17 denotes the first board edge.

The seventh embodiment as described above also has substantially the same working and effect as those of the first embodiment.

Figure 13:
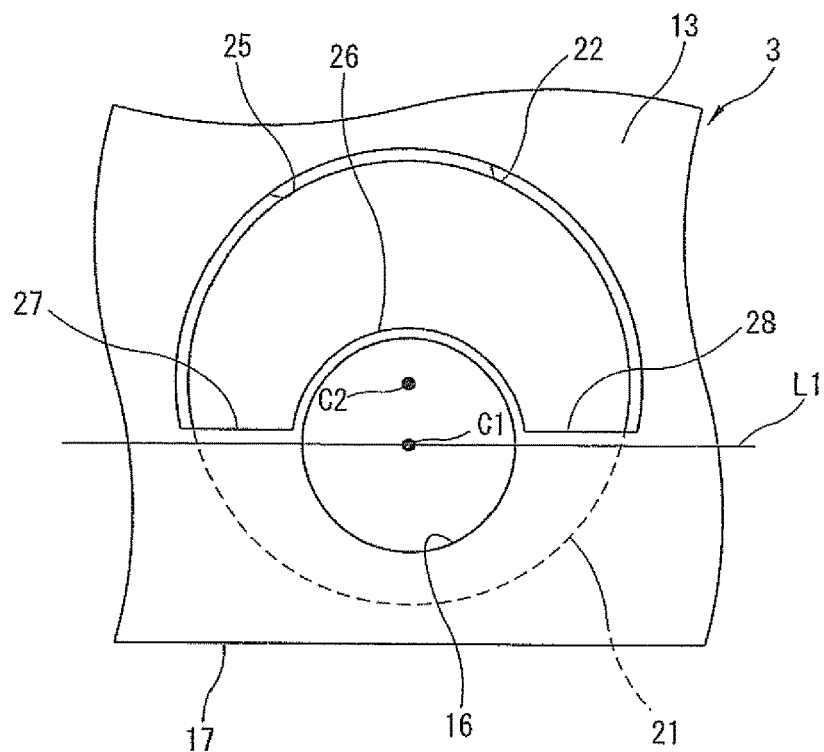
FIG. 13 is an enlarged plan view of an essential part of the circuit board according to an eighth embodiment of the present invention.

An eighth embodiment will be explained with reference to FIG. 13. FIG. 13 is an enlarged plan view of an essential part of the circuit board 3 according to the eighth embodiment of the present invention. This eighth embodiment has substantially the same configuration as that of the first embodiment. Also in the eighth embodiment, the joining portion 23 is formed so that the area of the joining portion 23 located at the inner side of the circuit board 3 with respect to the center C1 of the connector fixing screw penetration hole 16 is relatively large.

However, in the eighth embodiment, a center C2 of the screw land 21 is offset from the center C1 of the connector fixing screw penetration hole 16 toward the inner side of the circuit board 3. In other words, the center C2 of the screw land 21 is formed at a position that is shifted from the center C1 of the connector fixing screw penetration hole 16 toward the first board edge side that is relatively away from the connector fixing screw penetration hole 16. The center C2 of the screw land 21 is a center of an outside shape (an outside diameter) of the screw land 21.

Then, the joining portion 23 and the resist layer opening 22 of the eighth embodiment are each formed at the first board edge side that is relatively away from the connector fixing screw penetration hole 16 with respect to the first reference line L1.

In FIG. 13, a reference sign 17 denotes the first board edge. A reference sign 25 in FIG. 13 denotes the outer side curve. Here, a center of curvature of the outer side curve 25 of the eighth embodiment is the center C2 of the screw land 21. A reference sign 26 in FIG. 13 denotes the inner side curve. A reference sign 27 in FIG. 13 denotes the first end side, and a reference sign 28 in FIG. 13 denotes the second end side.

The eighth embodiment as described above also has substantially the same working and effect as those of the first embodiment.

Figure 14:
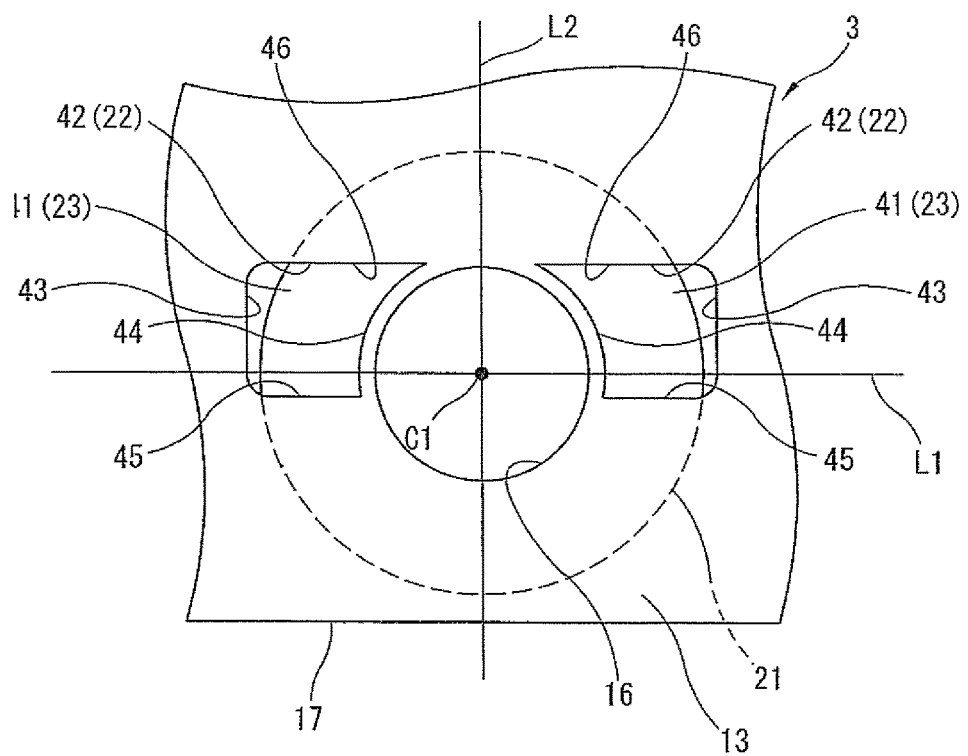
FIG. 14 is an enlarged plan view of an essential part of the circuit board according to a ninth embodiment of the present invention.

A ninth embodiment will be explained with reference to FIG. 14. FIG. 14 is an enlarged plan view of an essential part of the circuit board 3 according to the ninth embodiment of the present invention. This ninth embodiment has substantially the same configuration as that of the first embodiment. Also in the ninth embodiment, the joining portion 23 is formed so that the area of the joining portion 23 located at the inner side of the circuit board 3 with respect to the center C1 of the connector fixing screw penetration hole 16 is relatively large.

However, the joining portion 23 of the ninth embodiment is formed by a pair of first solder joining portions 41 and 41 located at opposite sides of the connector fixing screw penetration hole 16.

The pair of first solder joining portions 41 and 41 are formed at positions that are symmetric with respect to the line L2 that is parallel to the second board edge 18 of the circuit board 3 and passes through the center C1 of the connector fixing screw penetration hole 16.

The first solder joining portion 41 of the ninth embodiment is formed so that an area of the first solder joining portion 41 located at the middle side between the pair of first board edges with respect to the first reference line L1 is larger than an area of the first solder joining portion 41 located at the first board edge side that is close to the connector fixing screw penetration hole 16 with respect to the first reference line L1.

More specifically, the first solder joining portion 41 of the ninth embodiment is formed so that an area of the first solder joining portion 41 located at the inner side of the circuit board 3 with respect to the center C1 of the connector fixing screw penetration hole 16 is larger than an area of the first solder joining portion 41 located at the outer side of the circuit board 3 with respect to the center C1 of the connector fixing screw penetration hole 16. In other words, the first solder joining portion 41 of the ninth embodiment is formed so that the area of the first solder joining portion 41 located at the first board edge side that is relatively away from the connector fixing screw penetration hole 16 is larger than the area of the first solder joining portion 41 located at the first board edge side that is relatively close to the connector fixing screw penetration hole 16.

To put it another way, the first solder joining portion 41 of the ninth embodiment is formed so that the area of the first solder joining portion 41 located at the middle side between the pair of first board edges with respect to the first reference line L1 is larger than the area of the first solder joining portion 41 located at the first board edge side that is close to the connector fixing screw penetration hole 16 with respect to the first reference line L1.

More specifically, the first solder joining portion 41 of the ninth embodiment is formed so that a portion of the first solder joining portion 41 located at the inner side of the circuit board 3 with respect to the center C1 of the connector fixing screw penetration hole 16 and facing to the outer circumferential edge of the connector fixing screw penetration hole 16 is longer than a portion of the first solder joining portion 41 located at the outer side of the circuit board 3 with respect to the center C1 of the connector fixing screw penetration hole 16 and facing to the outer circumferential edge of the connector fixing screw penetration hole 16. In other words, the first solder joining portion 41 is formed so that a portion of the first solder joining portion 41 located at the first board edge side that is relatively away from the connector fixing screw penetration hole 16 and facing to the outer circumferential edge of the connector fixing screw penetration hole 16 is longer than a portion of the first solder joining portion 41 located at the first board edge side that is relatively close to the connector fixing screw penetration hole 16 and facing to the outer circumferential edge of the connector fixing screw penetration hole 16. The portion, facing to the outer circumferential edge of the connector fixing screw penetration hole 16, of the first solder joining portion 41 is an inner circumferential edge of the first solder joining portion 41.

Then, the first solder joining portion 41 of the ninth embodiment is formed so that end portions of the first solder joining portion 41 in the circumferential direction of the center axis of the connector fixing screw penetration hole 16 are parallel to the first reference line L1.

The resist layer opening 22 of the ninth embodiment is formed by a pair of resist layer first openings 42 and 42 located at opposite sides of the connector fixing screw penetration hole 16.

The pair of resist layer first openings 42 and 42 are formed at positions that are symmetric with respect to the second reference line L2.

The resist layer opening 22 of the ninth embodiment is formed so that an area of the resist layer opening 22 located at the middle side between the pair of first board edges with respect to the center C1 of the connector fixing screw penetration hole 16 is larger than an area of the resist layer opening 22 located at the first board edge side that is close to the connector fixing screw penetration hole 16 with respect to the center C1 of the connector fixing screw penetration hole 16. In other words, the resist layer opening 22 of the ninth embodiment is formed so that an area of the resist layer opening 22 located at the middle side between the pair of first board edges with respect to the first reference line L1 is larger than an area of the resist layer opening 22 located at the first board edge side that is close to the connector fixing screw penetration hole 16 with respect to the first reference line L1.

The resist layer first opening 42 is formed by an outer side 43, an inner side 44, a first end side 45 that connects one end of the outer side 43 and one end of the inner side 44 and a second end side 46 that connects the other end of the outer side 43 and the other end of the inner side 44.

The outer side 43 of the ninth embodiment is formed so as to be parallel to the second reference line L2 and positioned outside the screw land 21.

The outer side 43 of the ninth embodiment is formed so that a length of the outer side 43 located at the middle side between the pair of first board edges with respect to the center C1 of the connector fixing screw penetration hole 16 is longer than a length of the outer side 43 located at the first board edge side that is close to the connector fixing screw penetration hole 16 with respect to the center C1 of the connector fixing screw penetration hole 16. In other words, the outer side 43 of the ninth embodiment is formed so that a length of the outer side 43 located at the middle side between the pair of first board edges with respect to the center C1 of the connector fixing screw penetration hole 16 is longer than a length of the outer side 43 located at the first board edge side that is close to first reference line L1 with respect to the first reference line L1.

The inner side 44 of the ninth embodiment has an arc shape. The inner side 44 of the ninth embodiment is formed so as to be located at an inner side with respect to the outer side 43 in the radial direction of the center axis of the connector fixing screw penetration hole 16 and located at an outer side with respect to the opening of the connector fixing screw penetration hole 16.

The inner side 44 of the ninth embodiment is formed so that a length of the inner side 44 located at the middle side between the pair of first board edges with respect to the center C1 of the connector fixing screw penetration hole 16 is longer than a length of the inner side 44 located at the first board edge side that is close to the connector fixing screw penetration hole 16 with respect to the center C1 of the connector fixing screw penetration hole 16. In other words, the inner side 44 of the ninth embodiment is formed so that a length of the inner side 44 located at the middle side between the pair of first board edges with respect to the center C1 of the connector fixing screw penetration hole 16 is longer than a length of the inner side 44 located at the first board edge side that is close to first reference line L1 with respect to the first reference line L1.

The first end side 45 of the ninth embodiment has a linear shape. The first end side 45 of the ninth embodiment is formed at the outer side of the circuit board 3 with respect to the center C1 of the connector fixing screw penetration hole 16. In other words, the first end side 45 of the ninth embodiment has the linear shape and is formed at the first board edge side that is relatively close to the connector fixing screw penetration hole 16 with respect to the first reference line L1.

The second end side 46 of the ninth embodiment has a linear shape. The second end side 46 of the ninth embodiment is formed at the inner side of the circuit board 3 with respect to the center C1 of the connector fixing screw penetration hole 16. In other words, the second end side 46 of the ninth embodiment has the linear shape and is formed at the first board edge side that is relatively away from the connector fixing screw penetration hole 16 with respect to the first reference line L1.

Further, the first end side 45 and the second end side 46 of the ninth embodiment are each formed so as to extend across a part of the screw land 21 and be parallel to the first reference line L1.

In FIG. 14, a reference sign 17 denotes the first board edge.

The ninth embodiment as described above also has substantially the same working and effect as those of the first embodiment.

Figure 15:
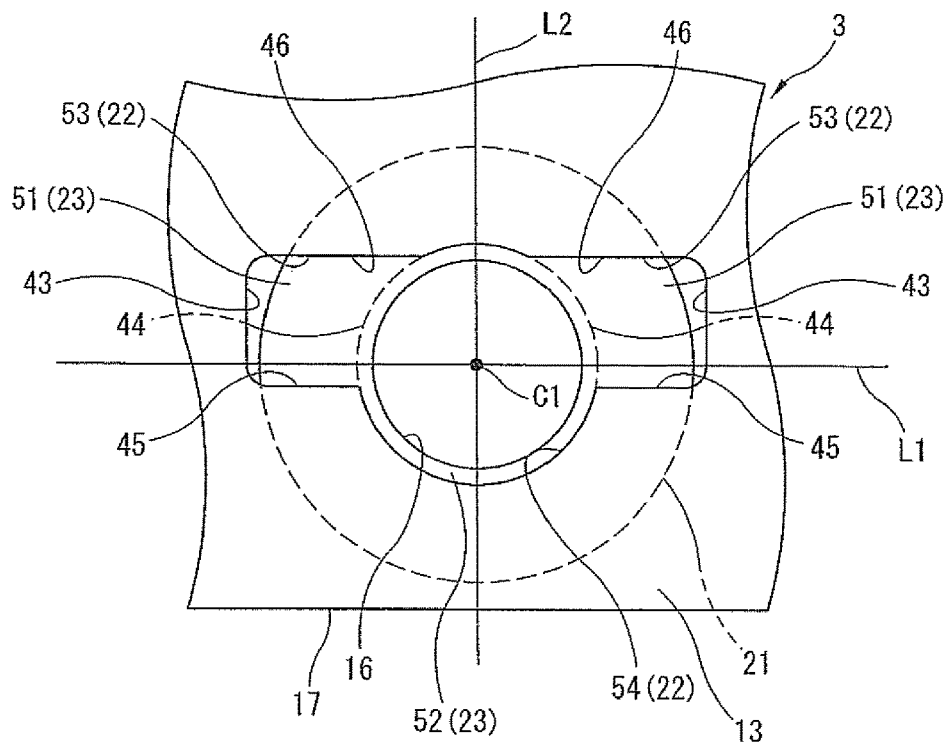
FIG. 15 is an enlarged plan view of an essential part of the circuit board according to a tenth embodiment of the present invention.

A tenth embodiment will be explained with reference to FIG. 15. FIG. 15 is an enlarged plan view of an essential part of the circuit board 3 according to the tenth embodiment of the present invention. This tenth embodiment has substantially the same configuration as that of the first embodiment. Also in the tenth embodiment, the joining portion 23 is formed so that the area of the joining portion 23 located at the inner side of the circuit board 3 with respect to the center C1 of the connector fixing screw penetration hole 16 is relatively large.

However, the joining portion 23 of the tenth embodiment is formed by a pair of first solder joining portions 51 and 51 located at opposite sides of the connector fixing screw penetration hole 16 and an annular solder joining portion 52 continuously encircling an entire circumference of the connector fixing screw penetration hole 16.

A configuration of the first solder joining portion 51 of the tenth embodiment is the same as that of the first solder joining portion 41 of the ninth embodiment described above.

The annular solder joining portion 52 of the tenth embodiment is formed so that its inside diameter is equal to an outside diameter of the connector fixing screw penetration hole 16.

The resist layer opening 22 of the tenth embodiment is formed by a pair of resist layer first openings 53 and 53 located at opposite sides of the connector fixing screw penetration hole 16 and an annular resist layer second opening 54 continuously encircling the entire circumference of the connector fixing screw penetration hole 16.

The resist layer opening 22 of the tenth embodiment is formed so that an area of the resist layer opening 22 located at the inner side of the circuit board 3 with respect to the center C1 of the connector fixing screw penetration hole 16 is relatively large.

A configuration of the resist layer first opening 53 of the tenth embodiment is the same as that of the resist layer first opening 42 of the ninth embodiment described above.

The resist layer second opening 54 of the tenth embodiment has an annular shape, and continues to or is joined to the pair of resist layer first openings 53 and 53. The resist layer second opening 54 of the tenth embodiment is formed so that its inside diameter is equal to the outside diameter of the connector fixing screw penetration hole 16 and its outside diameter is smaller than the outside diameter of the screw land 21. The resist layer second opening 54 of the tenth embodiment is formed so that its outside diameter overlaps the inner side 44 of the resist layer first opening 53.

In FIG. 15, a reference sign 17 denotes the first board edge, a reference sign 43 denotes the outer side, a reference sign 45 denotes the first end side, and a reference sign 46 denotes the second end side.

The tenth embodiment as described above also has substantially the same working and effect as those of the first embodiment.

Figure 16:
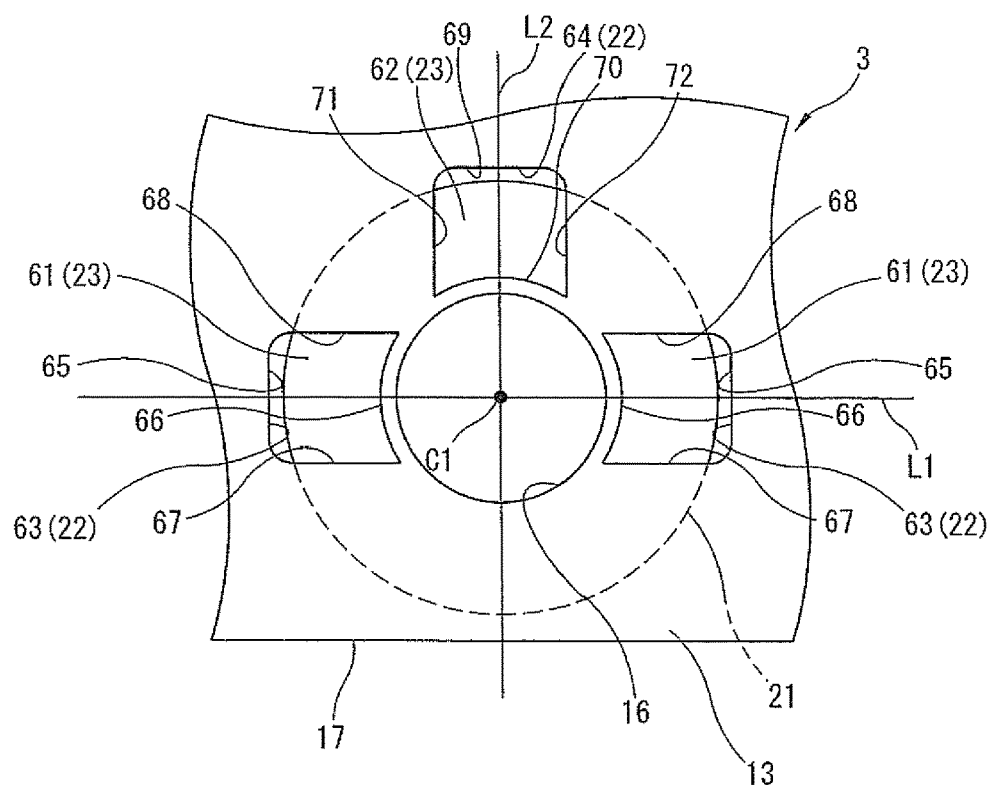
FIG. 16 is an enlarged plan view of an essential part of the circuit board according to an eleventh embodiment of the present invention.

An eleventh embodiment will be explained with reference to FIG. 16. FIG. 16 is an enlarged plan view of an essential part of the circuit board 3 according to the eleventh embodiment of the present invention. This eleventh embodiment has substantially the same configuration as that of the first embodiment. Also in the eleventh embodiment, the joining portion 23 is formed so that the area of the joining portion 23 located at the inner side of the circuit board 3 with respect to the center C1 of the connector fixing screw penetration hole 16 is relatively large.

However, the joining portion 23 of the eleventh embodiment has a plurality of solder joining portions arranged radially with respect to the center C1 of the connector fixing screw penetration hole 16.

More specifically, the joining portion 23 of the eleventh embodiment is formed by a pair of first solder joining portions 61 and 61 located at opposite sides of the connector fixing screw penetration hole 16 and a second solder joining portion 62 located between the pair of first solder joining portions 61 and 61 in the circumferential direction of the center axis of the connector fixing screw penetration hole 16.

The first solder joining portion 61 and the second solder joining portion 62 of the eleventh embodiment are formed into the same shape.

The first solder joining portion 61 is formed at a position at which the first solder joining portion 61 is divided into two by the first reference line L1.

The second solder joining portion 62 is formed at a position at which the second solder joining portion 62 is divided into two by the second reference line L2 that is parallel to the second board edge 18 of the circuit board 3 and passes through the center C1 of the connector fixing screw penetration hole 16.

Also in this eleventh embodiment described above, the area of the joining portion 23 located at the inner side of the circuit board 3 with respect to the center C1 of the connector fixing screw penetration hole 16 is larger than the area of the joining portion 23 located at the outer side of the circuit board 3 with respect to the center C1 of the connector fixing screw penetration hole 16.

The resist layer opening 22 of the eleventh embodiment is formed by a pair of resist layer first openings 63 and 63 located at opposite sides of the connector fixing screw penetration hole 16 and a resist layer second opening 64 located between the pair of resist layer first openings 63 and 63 in the circumferential direction of the center axis of the connector fixing screw penetration hole 16. The resist layer first opening 63 and the resist layer second opening 64 are formed into the same shape.

In the eleventh embodiment, the pair of resist layer first openings 63 and 63 are formed at positions that are symmetric with respect to the line L2.

The resist layer first opening 63 of the eleventh embodiment is formed at a position at which the resist layer first opening 63 is divided into two by the first reference line L1.

The resist layer second opening 64 of the eleventh embodiment is located at the middle side between the pair of first board edges with respect to the center C1 of the connector fixing screw penetration hole 16.

The resist layer first opening 63 of the eleventh embodiment is formed by an outer side 65, an inner side 66, a first end side 67 that connects one end of the outer side 65 and one end of the inner side 66 and a second end side 68 that connects the other end of the outer side 65 and the other end of the inner side 66.

The outer side 65 of the resist layer first opening 63 of the eleventh embodiment is formed so as to be parallel to the second reference line L2 and positioned outside the screw land 21.

The inner side 66 of the resist layer first opening 63 of the eleventh embodiment has an arc shape. The inner side 66 of the resist layer first opening 63 of the eleventh embodiment is formed so as to be located at an inner side with respect to the outer side 65 in the radial direction of the center axis of the connector fixing screw penetration hole 16 and located at an outer side with respect to the opening of the connector fixing screw penetration hole 16.

The first end side 67 of the resist layer first opening 63 of the eleventh embodiment has a linear shape. The first end side 67 of the resist layer first opening 63 of the eleventh embodiment is formed at the outer side of the circuit board 3 with respect to the center C1 of the connector fixing screw penetration hole 16. In other words, the first end side 67 of the resist layer first opening 63 of the eleventh embodiment has the linear shape and is formed at the first board edge side that is relatively close to the connector fixing screw penetration hole 16 with respect to the first reference line L1.

The second end side 68 of the resist layer first opening 63 of the eleventh embodiment has a linear shape. The second end side 68 of the resist layer first opening 63 of the eleventh embodiment is formed at the inner side of the circuit board 3 with respect to the center C1 of the connector fixing screw penetration hole 16. In other words, the second end side 68 of the resist layer first opening 63 of the eleventh embodiment has the linear shape and is formed at the first board edge side that is relatively away from the connector fixing screw penetration hole 16 with respect to the first reference line L1.

Further, the first end side 67 and the second end side 68 of the resist layer first opening 63 of the eleventh embodiment are each formed so as to extend across a part of the screw land 21 and be parallel to the first reference line L1.

The resist layer second opening 64 of the eleventh embodiment is formed by an outer side 69, an inner side 70, a first end side 71 that connects one end of the outer side 69 and one end of the inner side 70 and a second end side 72 that connects the other end of the outer side 69 and the other end of the inner side 70.

The outer side 69 of the resist layer second opening 64 of the eleventh embodiment is formed so as to be parallel to the first reference line L1 and positioned outside the screw land 21.

The inner side 70 of the resist layer second opening 64 of the eleventh embodiment has an arc shape. The inner side 70 of the resist layer second opening 64 of the eleventh embodiment is formed so as to be located at an inner side with respect to the outer side 69 in the radial direction of the center axis of the connector fixing screw penetration hole 16 and located at an outer side with respect to the opening of the connector fixing screw penetration hole 16.

The first end side 71 and the second end side 72 of the eleventh embodiment each have a linear shape. The first end side 71 and the second end side 72 of the eleventh embodiment are each formed at the inner side of the circuit board 3 with respect to the center C1 of the connector fixing screw penetration hole 16.

Further, the first end side 71 and the second end side 72 of the eleventh embodiment are each formed so as to extend across a part of the screw land 21 and be parallel to the second reference line L2.

In FIG. 16, a reference sign 17 denotes the first board edge.

The eleventh embodiment as described above also has substantially the same working and effect as those of the first embodiment.

Here, the number of the plurality of solder joining portions of the eleventh embodiment is not limited to three.

Figure 17:
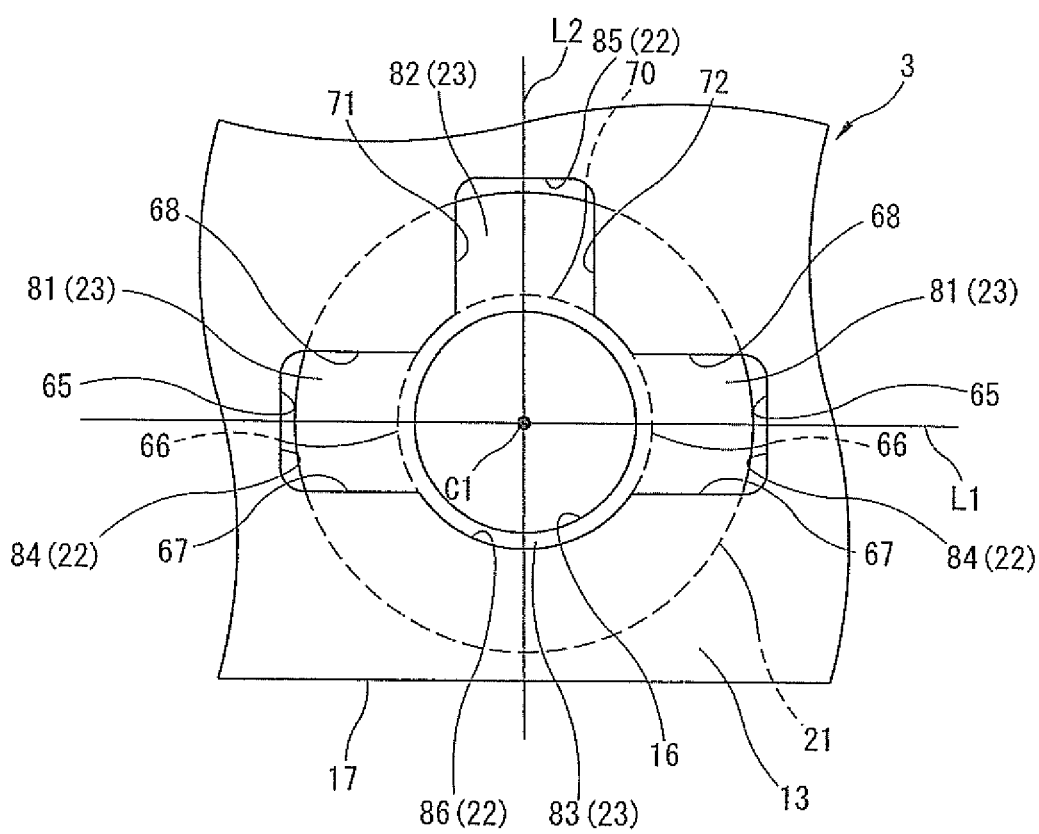
FIG. 17 is an enlarged plan view of an essential part of the circuit board according to a twelfth embodiment of the present invention.

A twelfth embodiment will be explained with reference to FIG. 17. FIG. 17 is an enlarged plan view of an essential part of the circuit board 3 according to the twelfth embodiment of the present invention. This twelfth embodiment has substantially the same configuration as that of the first embodiment. Also in the twelfth embodiment, the joining portion 23 is formed so that the area of the joining portion 23 located at the inner side of the circuit board 3 with respect to the center C1 of the connector fixing screw penetration hole 16 is relatively large.

However, the joining portion 23 of the twelfth embodiment is formed by a plurality of solder joining portions arranged radially with respect to the center C1 of the connector fixing screw penetration hole 16 and an annular solder joining portion 83 continuously encircling an entire circumference of the connector fixing screw penetration hole 16.

The plurality of solder joining portions of the twelfth embodiment are formed by a pair of first solder joining portions 81 and 81 located at opposite sides of the connector fixing screw penetration hole 16 and a second solder joining portion 82 located between the pair of first solder joining portions 81 and 81 in the circumferential direction of the center axis of the connector fixing screw penetration hole 16.

A configuration of the first solder joining portion 81 of the twelfth embodiment is the same as that of the first solder joining portion 61 of the eleventh embodiment described above. A configuration of the second solder joining portion 82 of the twelfth embodiment is the same as that of the second solder joining portion 62 of the eleventh embodiment described above.

The annular solder joining portion 83 of the twelfth embodiment is formed so that its inside diameter is equal to the outside diameter of the connector fixing screw penetration hole 16.

The resist layer opening 22 of the twelfth embodiment is formed by a pair of resist layer first openings 84 and 84 located at opposite sides of the connector fixing screw penetration hole 16, a resist layer second opening 85 located between the pair of resist layer first openings 84 and 84 in the circumferential direction of the center axis of the connector fixing screw penetration hole 16 and an annular resist layer third opening 86 continuously encircling the entire circumference of the connector fixing screw penetration hole 16.

A configuration of the resist layer first opening 84 of the twelfth embodiment is the same as that of the resist layer first opening 63 of the eleventh embodiment described above.

A configuration of the resist layer second opening 85 of the twelfth embodiment is the same as that of the resist layer second opening 64 of the eleventh embodiment described above.

The resist layer third opening 86 of the twelfth embodiment has an annular shape, and continues to or is joined to the pair of resist layer first openings 84 and 84 and the resist layer second opening 85. The resist layer third opening 86 of the twelfth embodiment is formed so that its inside diameter is equal to the outside diameter of the connector fixing screw penetration hole 16 and its outside diameter is smaller than the outside diameter of the screw land 21. The resist layer third opening 86 of the twelfth embodiment is formed so that its outside diameter overlaps the inner side 66 of the resist layer first opening 84 and the inner side 70 of the resist layer second opening 85.

In FIG. 17, a reference sign 17 denotes the first board edge. In FIG. 17, a reference sign 65 denotes the outer side of the resist layer first opening 84, a reference sign 67 denotes the first end side of the resist layer first opening 84, and a reference sign 68 denotes the second end side of the resist layer first opening 84. In FIG. 17, a reference sign 69 denotes the outer side of the resist layer second opening 85, a reference sign 71 denotes the first end side of the resist layer second opening 85, and a reference sign 72 denotes the second end side of the resist layer second opening 85.

The twelfth embodiment as described above also has substantially the same working and effect as those of the first embodiment.

Here, the number of the plurality of solder joining portions of the twelfth embodiment is not limited to three.

Although the present invention has been explained above on the basis of the above embodiments, the present invention is not limited to the above embodiments. For instance, in the first to fifth and ninth to twelfth embodiments, in the same manner as the sixth embodiment, the center C2 of the screw land 21 could be offset from the center C1 of the connector fixing screw penetration hole 16.

As the electronic control device based on the above embodiments, for instance, the followings are raised.

An electronic control device comprises: a circuit board mounting thereon electronic components; and a connector fixed to a board edge of the circuit board and electrically connecting an electronic circuit formed on the circuit board and an external device. The circuit board has: a penetration hole which a fixing member for fixing the connector to the circuit board penetrates; a resist layer having insulating nature and covering a surface of the circuit board; and a joining portion which is formed at a circumference of the penetration hole and to which the fixing member can be soldered. The resist layer has a resist layer opening which is open at the circumference of the penetration hole. The joining portion formed at an inner side of the resist layer opening. The joining portion is formed so that an area of the joining portion located at an inner side of the circuit board with respect to a center of the penetration hole is larger than an area of the joining portion located at an outer side of the circuit board with respect to the center of the penetration hole.

The circuit board has an annular land at the circumference of the penetration hole, and the resist layer is formed so as to cover the land. The joining portion is a part, which is exposed through the resist layer opening, of the land.

A portion, which is located at the inner side of the circuit board with respect to the center of the penetration hole, of the fixing member is fixed to the joining portion by soldering.

The joining portion is formed so that a portion of the joining portion located at the inner side of the circuit board with respect to the center of the penetration hole and facing to an outer circumferential edge of the penetration hole is longer than a portion of the joining portion located at the outer side of the circuit board with respect to the center of the penetration hole and facing to the outer circumferential edge of the penetration hole.

The joining portion could be formed at the inner side of the circuit board with respect to the center of the penetration hole.

The circuit board is formed into a rectangular plate shape, and has a pair of first board edges that are located on opposite sides of the circuit board and a pair of second board edges that are located on opposite sides of the circuit board. And, the joining port ion could be formed so that an area of the joining portion located at a middle side between the pair of first board edges with respect to the center of the penetration hole and also located at a middle side between the pair of second board edges with respect to the center of the penetration hole is larger than the other area of the joining portion.

The joining portion could be formed so as to be located at an inner side of the circuit board with respect to a portion, which is positioned closest to an outer edge of the circuit board, of the outer circumference of the penetration hole.

The joining portion could be formed so as to have a circular shape whose outside diameter is larger than the penetration hole and so that a center of the joining portion is offset from the center of the penetration hole toward the inner side of the circuit board.

The joining portion could be formed so as to have a pair of first solder joining portions located at opposite sides of the penetration hole. In this case, each of the first solder joining portions is formed so that an area of the first solder joining portion located at the inner side of the circuit board with respect to the center of the penetration hole is larger than an area of the first solder joining portion located at the outer side of the circuit board with respect to the center of the penetration hole.

The joining portion could be formed so as to have a pair of first solder joining portions located at opposite sides of the penetration hole and an annular solder joining portion continuously encircling an entire circumference of the penetration hole. In this case, each of the first solder joining portions is formed so that an area of the first solder joining portion located at the inner side of the circuit board with respect to the center of the penetration hole is larger than an area of the first solder joining portion located at the outer side of the circuit board with respect to the center of the penetration hole, and the first solder joining portions are joined to each other through the annular solder joining portion.

The joining portion could be formed so as to have a plurality of solder joining portions arranged radially with respect to the center of the penetration hole.

The joining portion could be formed so as to have a plurality of solder joining portions arranged radially with respect to the center of the penetration hole and an annular solder joining portion continuously encircling an entire circumference of the penetration hole. In this case, the solder joining portions are joined to each other through the annular solder joining portion.

The invention claimed is:

1. An electronic control device comprising:
   a circuit board mounting thereon electronic components; and
   a connector fixed to a board edge of the circuit board and electrically connecting an electronic circuit formed on the circuit board and an external device, and
   the circuit board having:
     a penetration hole which a fixing member for fixing the connector to the circuit board penetrates;
     a resist layer having insulating nature and covering a surface of the circuit board; and
     a joining portion which is formed at a circumference of the penetration hole and to which the fixing member can be soldered, and
   the resist layer having a resist layer opening which is open at the circumference of the penetration hole,
   the joining portion formed at an inner side of the resist layer opening, and
   the joining portion being formed so that an area of the joining portion located at an inner side of the circuit board with respect to a center of the penetration hole is larger than an area of the joining portion located at an outer side of the circuit board with respect to the center of the penetration hole.

2. The electronic control device as claimed in claim 1, wherein:
   the circuit board has an annular land at the circumference of the penetration hole,
   the resist layer is formed so as to cover the land, and
   the joining portion is a part, which is exposed through the resist layer opening, of the land.

3. The electronic control device as claimed in claim 1, wherein:

a portion, which is located at the inner side of the circuit board with respect to the center of the penetration hole, of the fixing member is fixed to the joining portion by soldering.

4. The electronic control device as claimed in claim 1, wherein:
the joining portion is formed so that a portion of the joining portion located at the inner side of the circuit board with respect to the center of the penetration hole and facing to an outer circumferential edge of the penetration hole is longer than a portion of the joining portion located at the outer side of the circuit board with respect to the center of the penetration hole and facing to the outer circumferential edge of the penetration hole.

5. The electronic control device as claimed in claim 1, wherein:
the joining portion is formed at the inner side of the circuit board with respect to the center of the penetration hole.

6. The electronic control device as claimed in claim 1, wherein:
the circuit board is formed into a rectangular plate shape, and has a pair of first board edges that are located on opposite sides of the circuit board and a pair of second board edges that are located on opposite sides of the circuit board, and
the joining portion is formed so that an area of the joining portion located at a middle side between the pair of first board edges with respect to the center of the penetration hole and also located at a middle side between the pair of second board edges with respect to the center of the penetration hole is larger than the other area of the joining portion.

7. The electronic control device as claimed in claim 1, wherein:
the joining portion is formed so as to be located at an inner side of the circuit board with respect to a portion, which is positioned closest to an outer edge of the circuit board, of the outer circumference of the penetration hole.

8. The electronic control device as claimed in claim 1, wherein:
the joining portion is formed so as to have a circular shape whose outside diameter is larger than the penetration hole and so that a center of the joining portion is offset from the center of the penetration hole toward the inner side of the circuit board.

9. The electronic control device as claimed in claim 1, wherein:
the joining portion has a pair of first solder joining portions located at opposite sides of the penetration hole, and
each of the first solder joining portions is formed so that an area of the first solder joining portion located at the inner side of the circuit board with respect to the center of the penetration hole is larger than an area of the first solder joining portion located at the outer side of the circuit board with respect to the center of the penetration hole.

10. The electronic control device as claimed in claim 1, wherein:
the joining portion has a pair of first solder joining portions located at opposite sides of the penetration hole and an annular solder joining portion continuously encircling an entire circumference of the penetration hole,
each of the first solder joining portions is formed so that an area of the first solder joining portion located at the inner side of the circuit board with respect to the center of the penetration hole is larger than an area of the first solder joining portion located at the outer side of the circuit board with respect to the center of the penetration hole, and
the first solder joining portions are joined to each other through the annular solder joining portion.

11. The electronic control device as claimed in claim 1, wherein:
the joining portion has a plurality of solder joining portions arranged radially with respect to the center of the penetration hole.

12. The electronic control device as claimed in claim 1, wherein:
the joining portion has a plurality of solder joining portions arranged radially with respect to the center of the penetration hole and an annular solder joining portion continuously encircling an entire circumference of the penetration hole, and
the solder joining portions are joined to each other through the annular solder joining portion.

* * * * *